United States Patent
Brown et al.

(10) Patent No.: US 12,557,217 B2
(45) Date of Patent: Feb. 17, 2026

(54) ZERO CLEARANCE BACKDRILLED PRINTED CIRCUIT BOARDS

(71) Applicant: NOKIA SOLUTIONS AND NETWORKS OY, Espoo (FI)

(72) Inventors: Paul Brown, Wakefield (CA); Alex Chan, Ottawa (CA); Daniel Anav, San Jose, CA (US); Jonathan Montag, San Jose, CA (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 219 days.

(21) Appl. No.: 18/427,277

(22) Filed: Jan. 30, 2024

(65) Prior Publication Data
US 2025/0247956 A1    Jul. 31, 2025

(51) Int. Cl.
*H05K 1/11*    (2006.01)
*H05K 1/02*    (2006.01)
*H05K 3/00*    (2006.01)

(52) U.S. Cl.
CPC ........... *H05K 1/115* (2013.01); *H05K 1/0298* (2013.01); *H05K 3/0047* (2013.01); *H05K 2201/09545* (2013.01); *H05K 2203/0207* (2013.01)

(58) Field of Classification Search
CPC .... H05K 1/115; H05K 1/0298; H05K 3/0047; H05K 2201/09545; H05K 2203/0207; H05K 3/429; H05K 3/4623
See application file for complete search history.

(56) References Cited

U.S. PATENT DOCUMENTS 8,158,892 B2 *  4/2012  Goergen ............... H05K 3/429
                                                   174/250
8,889,999 B2 * 11/2014  Thurairajaratnam .. H05K 1/024
                                                   174/262
(Continued)

FOREIGN PATENT DOCUMENTS

CN    113015316 A    6/2021

OTHER PUBLICATIONS

Michael Catrambone, "Managing Backdrilling from Library until Handoff to Manufacturing." https://www.cadence.com/content/dam/cadence-www/global/en_US/documents/tools/pcb-design-analysis/pcb-west-2016-40-managing-backdrill-cp.pdf.

*Primary Examiner* — Sherman Ng
(74) *Attorney, Agent, or Firm* — Kramer & Amado, P.C.

(57) ABSTRACT

A multi-layer printed circuit board (PCB), includes a first plurality of layers, each having a plurality of signal traces disposed thereon, a second plurality of layers, each having a voltage plane disposed thereon, and a plurality of plated-through-hole vias disposed between a first surface of the multi-layer PCB and a second surface of the multi-layer PCB, wherein each plated-through-hole via includes a conductive barrel, wherein a first layer of the first plurality of layers includes a backdrill clearance region around a first plated-through-hole via in which no signal traces are disposed, and a first voltage plane on a first layer of the second plurality of layers is in contact with the conductive barrel of the first plated-through-hole via. In various embodiments, portions of the barrel of a plated-through-hole via are removed by, for example, backdrilling. Various embodiments advantageously provide improvements to signal-to-reference overlap, and to power plane current-carrying capacity.

20 Claims, 20 Drawing Sheets

(56) References Cited

U.S. PATENT DOCUMENTS

| | | |
|---|---|---|
| 9,202,783 B1 | 12/2015 | Mark |
| 2005/0167811 A1* | 8/2005 | Frech .................. H05K 1/0216 |
| | | 257/E23.062 |
| 2020/0053880 A1 | 2/2020 | Matthew |
| 2023/0156928 A1 | 5/2023 | Steve |

* cited by examiner

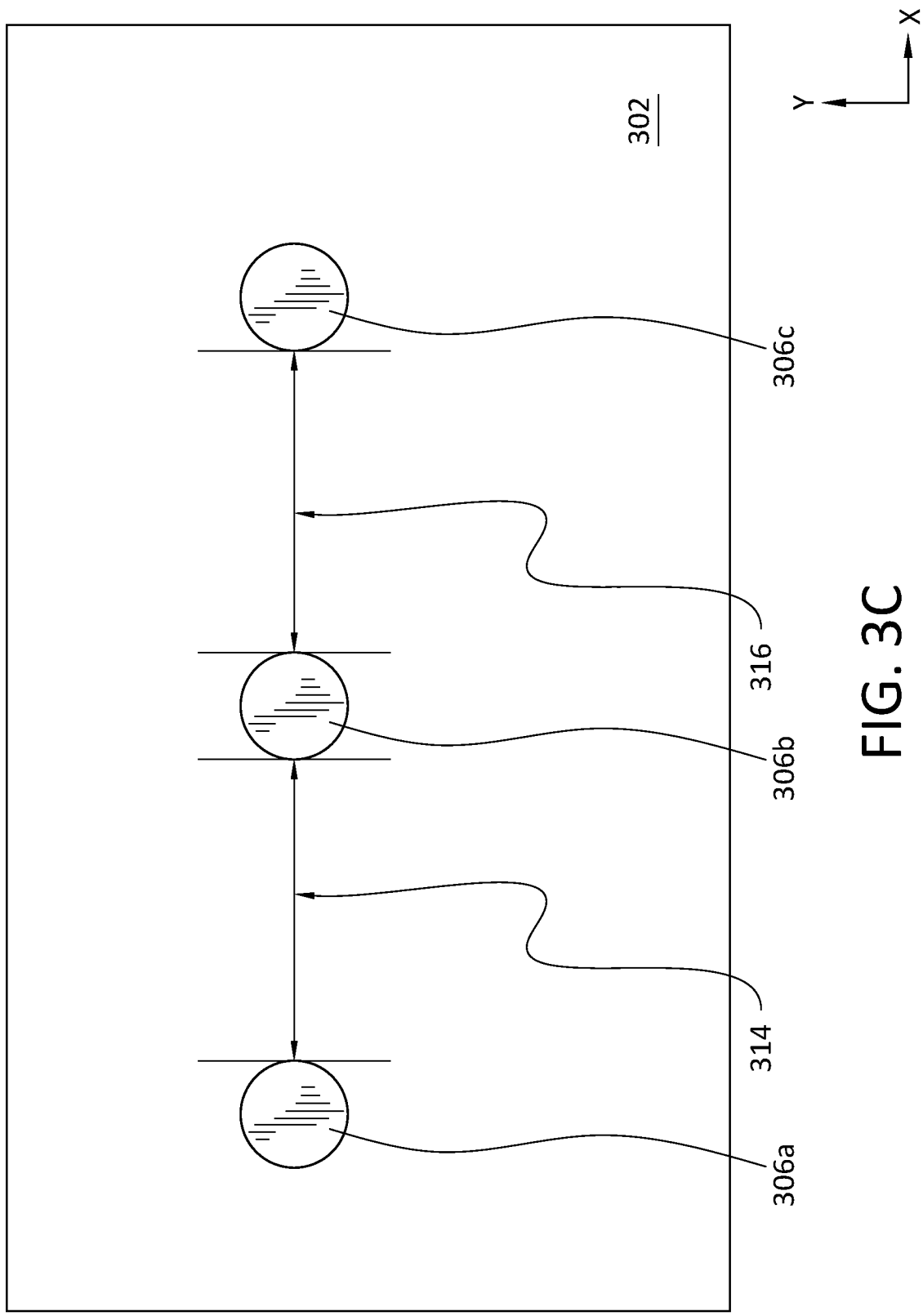

ZERO CLEARANCE BACKDRILLED PRINTED CIRCUIT BOARDS

FIELD OF THE DISCLOSURE

Various exemplary embodiments disclosed herein relate to the structure and manufacturing of printed circuit boards.

BACKGROUND

It is common for multi-layer printed circuit boards to have multiple signal-trace layers, multiple layers of conductive planes, and plated-through-hole (PTH) vias. In some instances a number of the PTH vias have a portion of their respective barrels removed, typically by backdrilling.

SUMMARY

A summary of various illustrative embodiments is presented below.

According to an aspect of this disclosure, a multi-layer printed circuit board (PCB) includes a plurality of signal-trace layers, each signal-trace layer having a plurality of signal traces; a plurality of voltage-plane layers, each voltage-plane layer having at least one voltage plane; and a plurality of plated-through-hole vias disposed between a first surface of the multi-layer PCB and a second surface of the multi-layer PCB, wherein each plated-through-hole via includes a conductive barrel; wherein each signal trace is spaced apart from every conductive barrel of each of the conductive barrels of the plurality of plated-through-hole vias by a predetermined minimum distance other than any conductive barrel with which it is in direct contact, and wherein a first voltage plane of a first voltage-plane layer is in direct contact with each of the conductive barrels of a first portion of the plurality of plated-through-hole vias, including the conductive barrels of the first portion of the plurality of plated-through-hole vias that are in direct contact with at least one signal trace.

In some embodiments of the multi-layer PCB, a second voltage plane of a second voltage-plane layer is in direct contact with each of the conductive barrels of a first portion of the plurality of plated-through-hole vias, including the conductive barrels of the first portion of the plurality of plated-through-hole vias that are in direct contact with at least one signal trace.

In some embodiments of the multi-layer PCB, the first voltage plane and the second voltage plane are each part of a first electrical node.

In some embodiments of the multi-layer PCB, a third voltage plane of a third voltage-plane layer is spaced apart from every conductive barrel of each of the conductive barrels of the plurality of plated-through-hole vias by the predetermined minimum distance other than any conductive barrel with which it is in direct contact.

In some embodiments of the multi-layer PCB, the plurality of signal-trace layers and the plurality of voltage-plane layers are inner layers of the multi-layer PCB.

According to another aspect of this disclosure, a multi-layer PCB includes a plurality of signal-trace layers, each signal-trace layer having a plurality of signal traces; a plurality of voltage-plane layers, each voltage-plane layer having at least one voltage plane; and a plurality of plated-through-hole vias disposed in the multi-layer PCB, each plated-through-hole via having a conductive barrel, wherein a first portion of the plated-through-holes have conductive barrels that extend from the first outer surface to a conductive barrel inner end located within the multi-layer PCB, and corresponding backdrilled shafts that extend from the conductive barrel inner end to the second outer surface, wherein a first voltage plane of a first voltage-plane-layer abuts at least one backdrilled shaft.

In some embodiments of the multi-layer PCB, a first portion of the plurality of plated-through-hole vias have conductive barrels that extend vertically from a first outer surface of the multi-layer PCB to a second outer surface of the multi-layer PCB, and each signal trace is spaced apart from every conductive barrel of the plurality of plated-through-hole vias by a predetermined minimum distance other than any conductive barrel with which the signal trace is in direct contact.

In some embodiments of the multi-layer PCB, a second voltage plane of a second voltage-plane-layer abuts at least one backdrilled shaft.

In some embodiments of the multi-layer PCB, the first voltage plane and the second voltage plane are each part of the same electrical node.

In some embodiments of the multi-layer PCB, the first voltage plane and the second voltage plane are vertically separated by at least one intervening signal-trace layer.

In some embodiments of the multi-layer PCB, at least one backdrilled shaft of the plurality of backdrilled shafts has non-conductive material disposed therein.

In some embodiments of the multi-layer PCB, the at least one backdrilled shaft is filled with the non-conductive material.

In some embodiments of the multi-layer PCB, a third voltage plane of a third voltage-plane layer is spaced apart from every conductive barrel of the plurality of plated-through-hole vias by the predetermined minimum distance other than any conductive barrel with which it is in direct contact.

In some embodiments of the multi-layer PCB, the third voltage plane is vertically disposed between the first voltage plane and the second voltage plane.

In some embodiments of the multi-layer PCB, at least one voltage plane has a plurality of holes, each hole having a diameter less than the predetermined minimum distance.

According to a further aspect of this disclosure, a method includes providing a multi-layer PCB, which includes a plurality of signal-trace layers, each signal-trace layer having a plurality of signal traces; a plurality of voltage-plane layers, each voltage-plane layer having at least one voltage plane; and a plurality of plated-through-hole vias disposed between a first surface of the multi-layer PCB and a second surface of the multi-layer PCB, wherein each plated-through-hole via includes a conductive barrel; wherein each signal trace is spaced apart from every conductive barrel of the plurality of plated-through-hole vias by a predetermined minimum distance other than any conductive barrel with which the signal trace is in direct contact, and wherein a first voltage plane of a first voltage-plane layer is in direct contact with the conductive barrel of each of at least a portion of the conductive barrels of the plurality of plated-through-hole vias; and the method further includes backdrilling one or more of the plurality of plated-through-hole vias to form a corresponding one or more backdrilled shafts, wherein, after backdrilling, the first voltage plane abuts at least one backdrilled shaft.

In some embodiments, the method further includes filling at least one of the one or more backdrilled shafts with a non-conductive filler material.

In some embodiments of the method, the provided multi-layer PCB further includes a second voltage plane of a second voltage-plane layer, the second voltage plane in direct contact with each of the conductive barrels of a first portion of the plurality of plated-through-hole vias, including the conductive barrels of the first portion of the plurality of plated-through-hole vias that are in direct contact with at least one signal trace.

In some embodiments of the method, the first voltage plane and the second voltage plane of the provided multi-layer PCB are each part of a first electrical node.

In some embodiments of the method, the provided multi-layer PCB further includes a third voltage plane of a third voltage-plane layer that is spaced apart from every conductive barrel of each of the conductive barrels of the plurality of plated-through-hole vias by the predetermined minimum distance other than any conductive barrel with which it is in direct contact.

BRIEF DESCRIPTION OF DRAWINGS

To better understand various illustrative embodiments, reference is made to the accompanying drawings, wherein:

FIG. 3C is a top view of a portion of a voltage plane of a multi-layer PCB having a copper web without backdrill clearance regions, and evenly spaced-apart backdrills, in accordance with this disclosure;

To facilitate understanding, identical reference numerals have been used to designate elements having substantially the same or similar structure and/or substantially the same or similar function.

DETAILED DESCRIPTION

Figure 1:
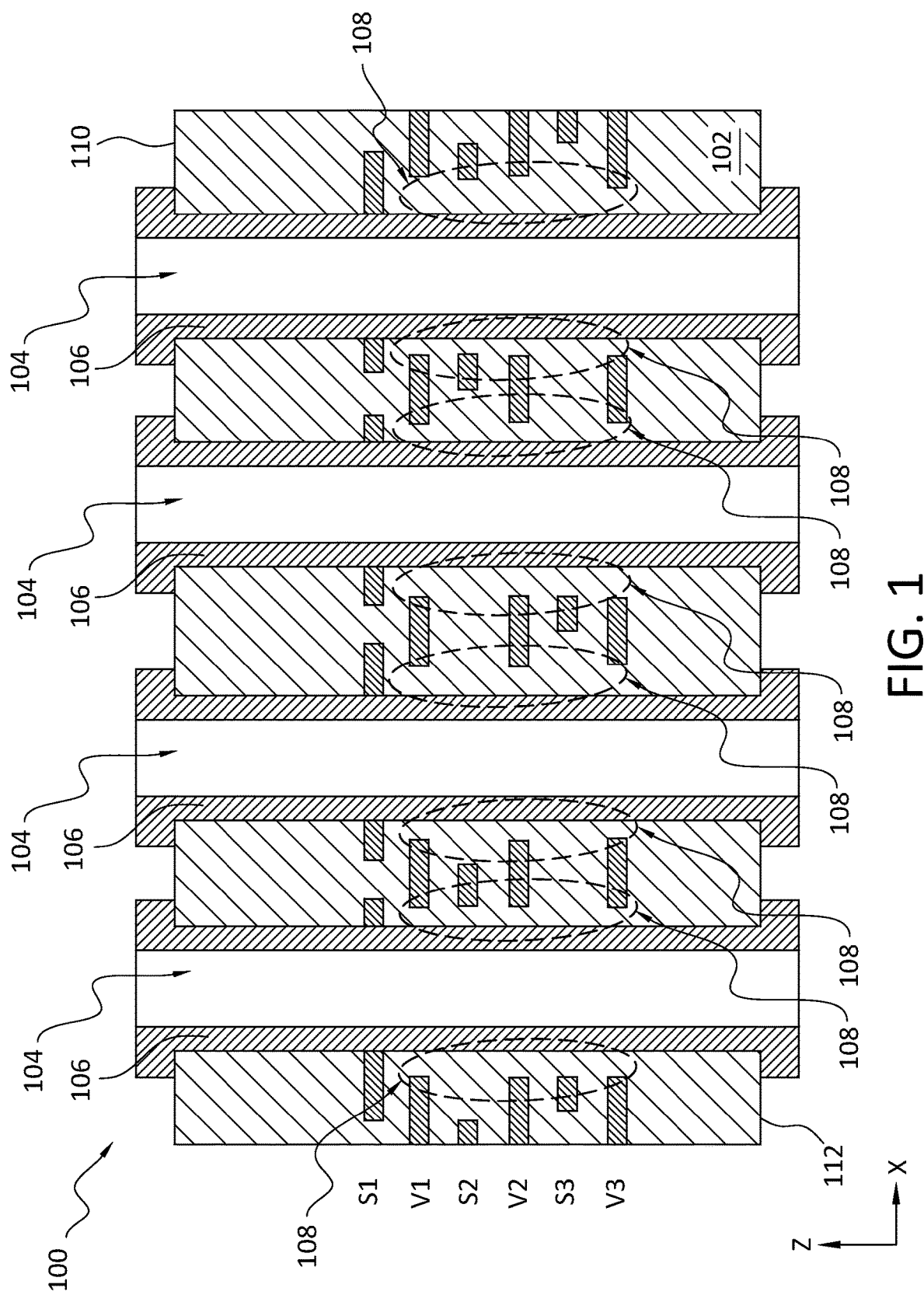
FIG. 1 is a cross-sectional view of a portion of a multi-layer printed circuit board (PCB) having plated through hole vias, and backdrill clearance regions on all layers except the must-not-cut signal layer.

Electrical circuits implemented on printed circuit boards, especially those carrying high-speed electrical signals, frequently employ the process of backdrilling the vertical interconnect (i.e., plated-through-hole vias) of a printed circuit board to reduce or eliminate unused portions of the vertical interconnects so that those unused portions will not cause unwanted signal reflections during operation. Various embodiments in accordance with this disclosure may improve signal reference, and/or may reduce losses of current-carrying capacity in the reference planes by applying different backdrill clearance regions to signal trace layers and power plane layers of a multi-layer printed circuit board, respectively.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Many modern electronic products are implemented with multi-layer printed circuit boards. A printed circuit board (PCB) serves as a platform for supporting and connecting various active and/or passive electronic components such as, but not limited to, integrated circuits, transistors, diodes, resistors, capacitors, and inductors. That is, a PCB provides mechanical support for, and electrically conductive interconnect pathways between, the various components disposed on the PCB.

A PCB has a substrate, or base material, which may be made of, for example, fiberglass-reinforced epoxy laminate, but PCBs are not limited to this material. To form electrically conductive pathways, an electrically conductive material, such as, but not limited to, a copper foil for example, is formed on the substrate. The electrically conductive material is then etched to from the desired pattern of conductive pathways. When the PCB is populated with components and operated, these conductive pathways may carry, for example, electrical signals. Such conductive pathways may also be referred to as "traces."

In general, PCBs may have a single-sided, double-sided, or multi-layer configuration. A single-sided PCB has electrically conductive pathways on one side thereof. A double-sided PCB has electrically conductive pathways on each of its two sides, i.e., each of its two major opposing surfaces. A multi-layer PCB includes multiple layers of electrically conductive material separated by electrically non-conductive insulation layers.

PCBs may have pads and/or lands to accommodate the placement and attachment of components thereto. Pads may be used, for example, in conjunction with through-hole components. Lands may be used, for example, in conjunction with surface-mount components.

PCBs in general, and multi-layer PCBs in particular may include plated-through-hole vias to provide electrical connection between conductive material on different layers of the PCB. The plated-through-hole vias may be referred to herein simply as vias. The plated-through-hole vias typically traverse the entire thickness of the PCB, thereby providing an electrical path from a front side to a back side of the PCB. In such an arrangement, the length of the plated-through-hole via is at least as long as the PCB is thick. Note that the front/back sides of the PCB may also be referred to as the top/bottom sides respectively.

As noted above, a plated-through-hole via may provide an electrical connection between, for example, signal traces on different layers of a multi-layer PCB. In many instances, the signal traces to be connected by the plated-through-hole vias are not separated by the thickness of the entire multi-layer PCB. That is, in many instances the separation of the signal traces to be connected is less than the thickness of the PCB. However, since the plated-through-hole via runs through the entire thickness of the PCB, there will be a portion of the plated-through-hole via that extends past the last layer to be connected by the via. That portion of the via that extends past the last layer to be connected is referred to herein as a via stub, or simply as a stub. Such stubs may adversely affect high frequency signals because of signal reflections.

Signal reflections occur when there is an impedance mismatch, sometimes referred to as an impedance discontinuity, along a signal path. For PCBs carrying high-speed signals, backdrilling of the vertical interconnect is frequently used to eliminate unused portions of these vertical interconnects (i.e., the via stubs) so that they will not cause unwanted signal reflections.

Backdrilling like other vertical PCB drilling operations employs clearances (sometimes referred to as "antipads") on layers beneath the drill, which are not meant to be contacted by the drill. These clearances have previously been applied to all layers of a multi-layer printed circuit board, regardless of the function of those layers, to eliminate the possibility of contact with the drill bit, or the drilled hole, thereby limiting the possibility of electrical shorting between conductors on different electrical nets.

Unfortunately, the application of these clearances comes at a cost to the design. The act of voiding significant amounts of any layer within the backdrill region, greatly reduces the usefulness of those layers. An effect which is only exacerbated as the pitch of the backdrilled shafts is reduced, such as is the situation under fine pitched ball grid arrays (BGAs). The clearances when applied to a signal layer may leave enough room between backdrilled vias to route a signal trace, however when applied to a ground plane, these clearances may decrease the ground plane in that area to a width no greater than that of a signal trace. This one-to-one sizing of signal trace over ground plane web represents the bare minimum signal-to-ground reference under ideal conditions (i.e., perfect registration). In this situation, any misregistration between layers will cause the misalignment of the signal trace to the ground plane web resulting in the signal losing reference (i.e., "de-reference") at that location. With loss of reference comes a significant shift in the trace impedance, resulting in significant impact to the signal integrity. Another undesirable consequence of implementing backdrill clearance regions on plane layers that are meant to carry power is that the overall current carrying capacity of the power plane in the area having backdrill clearance regions is significantly reduced. So, while the introduction of backdrilling has greatly improved signal integrity of the plated through via on high-speed signals, it has also significantly undermined the effectiveness of ground and power planes. Thus, these backdrill clearances are undesirable but without them, the backdrill would contact the copper foil of the plane layers as it bores its way through towards the signal connection point (on the must-not-cut (MNC) layer). The exposed copper from these plane layers being in very close vertical proximity to adjacent layers that themselves have been exposed are at high risk of causing electrical shorting, either by direct contact of metal swarf or, in the long run, through electromigration.

Various embodiments in accordance with this disclosure overcome these limitations by selectively eliminating these clearances, i.e., antipads, while mitigating the risks of elimination through careful implementation of novel design rules. The realization that the presence of exposed planes caused by the elimination of clearances only represents a reliability risk if the exposed planes are of different potentials and/or if these planes come too close to the signal via stub. By removing backdrill clearance regions only on voltage planes with the same reference voltage, and keeping the backdrill clearance regions on other layers (power, signal, or other class of ground) the web of copper that is formed between two backdrills can be increased, thereby increasing the signal-to ground-reference, for example. Conversely, if power distribution is the limiting factor, backdrill clearance regions can be eliminated on certain power layers and kept on signal and ground layers to ensure that the maximum possible width of copper web between backdrills is present to aid in current delivery. Since the requirement of exposing only planes of a common potential applies only on a hole-by-hole basis, application of this technique can be modified on a hole-by-hole basis to tailor the benefit depending on specific design needs.

Typically, the backdrill clearance regions required by a PCB fabricator are a fixed radial distance that must be incorporated at the design stage and reflected in the CAD files prior to fabrication to ensure that there is a sufficient margin to guarantee that a backdrill at the limit of its registration will not contact structures beyond this backdrill clearance region. Contact of the drill to these structures may have adverse consequences such as, but not limited to: 1) the infringing overlap will be removed (i.e., drilled out); and 2) the edge of the copper structure will be exposed in the backdrilled via barrel.

FIG. 1 illustrates some basic structural features of a multi-layered PCB. FIG. 1 is a cross-sectional view of a portion of a multi-layer PCB 100 having a substrate 102, plated-through-hole vias 104, barrels 106, which form the conductive portion of plated-through-hole vias 104, and backdrill clearance regions 108 on all layers except the must-not-cut signal-trace layer S1.

Substrate 102 may be made from a nonconductive material such as, but not limited to, a glass-reinforced epoxy laminate. The illustrative plated-through-hole vias 104 extend all the way through substrate 102 from a first surface 110 to a second opposite surface 112. Plated-through-hole vias 104 each have an electrically conductive barrel 106.

Multi-layer PCB 100 has a plurality of inner conductive layers, some of which are voltage planes (e.g., ground planes, power planes, reference planes, etc.), while others of those inner conductive layers contain signal traces. Six inner layers, S1, V1, S2, V2, S3, V3, disposed within multi-layer PCB 100 are illustrated. However, in general, multi-layer PCBs may have more or fewer layers. The six inner layers shown in FIG. 1 are for purposes of illustration and not limitation.

It is known that drill bits used during the backdrilling process, may not be perfectly aligned with the center of a plated-through-hole via. To prevent the drill bit from unintentionally damaging or removing conductive material from the inner layers of PCB 100, these conductive inner layers are spaced away from the barrels 106. In this way, misalignment or misregistration between the PCB and the drill bit do not cause unintended damage to, or removal of, the conductive layers (below the must-not-cut layer). Still referring to FIG. 1, backdrill clearance regions 108 represent a design requirement of various backdrilling processes to keep conductive planes and traces at a safe distance from the drill bit that is used to backdrill via stubs (i.e., remove the via stubs).

FIGS. 2A-2D, which are described in greater detail below, collectively illustrate various backdrilling scenarios including a range of backdrill registration, a range of backdrill clearance region sizes, and possible damage to a signal trace when the backdrill clearance region size is not sufficient to provide margin for a given range of backdrill registration.

Figure 2A:
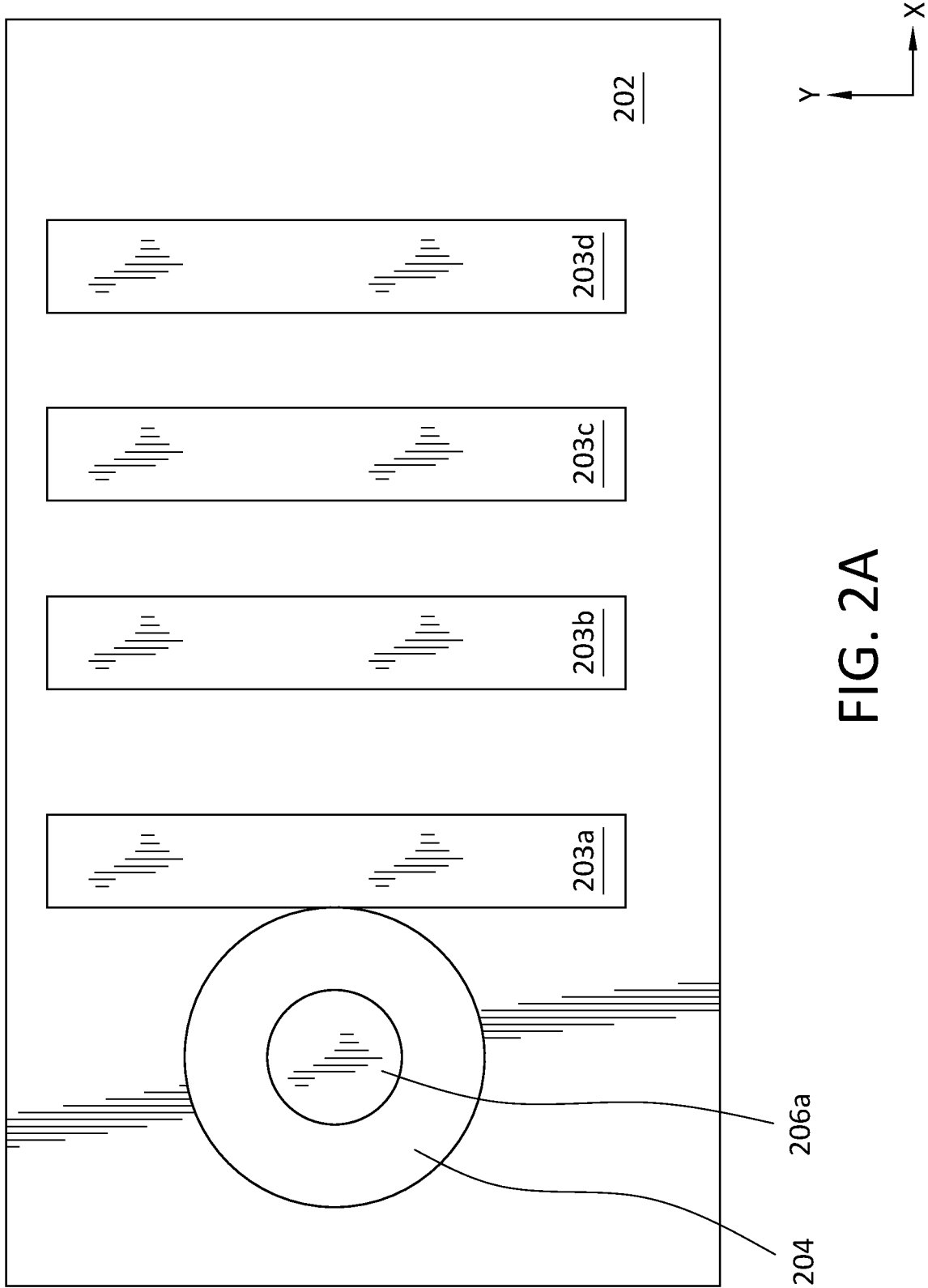
FIG. 2A is a top view of a portion of an inner signal-trace layer of a multi-layer PCB having an insulating layer with signal traces disposed thereon, a backdrill clearance region, and a backdrill centered in the middle of the backdrill clearance region.

FIG. 2A illustrates a portion of an inner layer of a PCB 202, with a signal traces 203a, 203b, 203c, and 203d, a backdrill clearance region 204, and a backdrill 206a centered in the middle of the appropriately-sized backdrill clearance region 204. Signal traces 203a, 203b, 203c, and 203d are formed of an electrically conductive material such as, but not limited to, copper. By "appropriately-sized backdrill clearance region," it is meant that the backdrill clearance region is large enough to protect conductive material adjacent to the barrel of a plated-through-hole via from being damaged or removed by the backdrilling process.

Figure 2B:
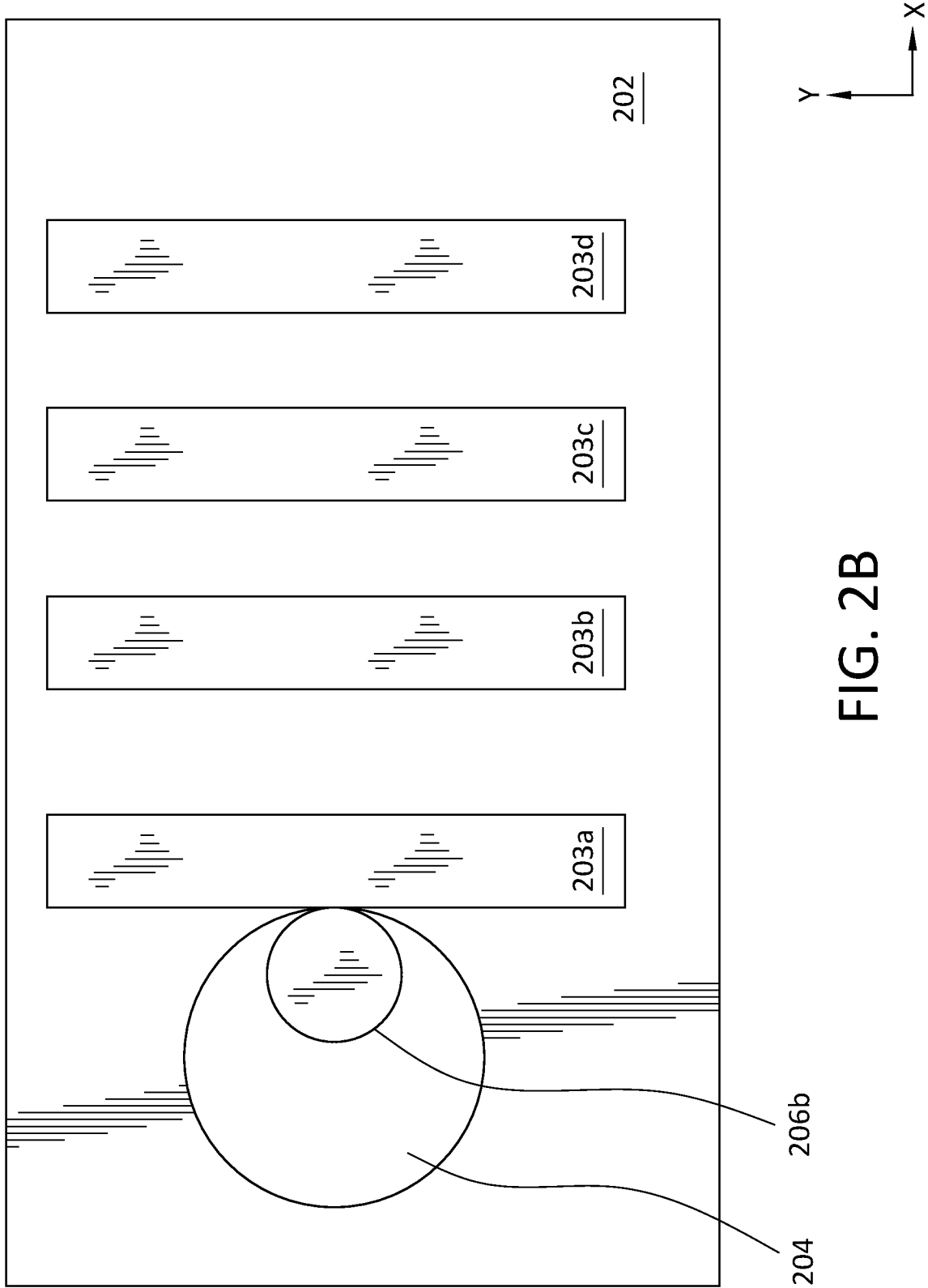
FIG. 2B is a top view of a portion of an inner signal-trace layer of a multi-layer PCB having an insulating layer with signal traces disposed thereon, and a backdrill clearance region, as shown in FIG. 2A, and further illustrates a backdrill at the extreme edge of its registration range but still within the backdrill clearance region.

FIG. 2B illustrates PCB 202, with signal traces 203a, 203b, 203c, and 203d, and backdrill clearance 204 all as shown in FIG. 2A. However, as shown in FIG. 2B, a backdrill 206b is at the limit of its registration. That is, backdrill 206b is not aligned with the center of backdrill clearance region 204 (as shown in FIG. 2A), but rather the registration of backdrill 206b results in backdrill 206b being disposed substantially adjacent to an edge of backdrill clearance region 204. In this instance, because backdrill clearance region 204 has been appropriately sized to accommodate the registration range of the backdrill, signal trace 203a, which is nearby to backdrill clearance region 204, remains undamaged by backdrill 206b.

Figure 2C:
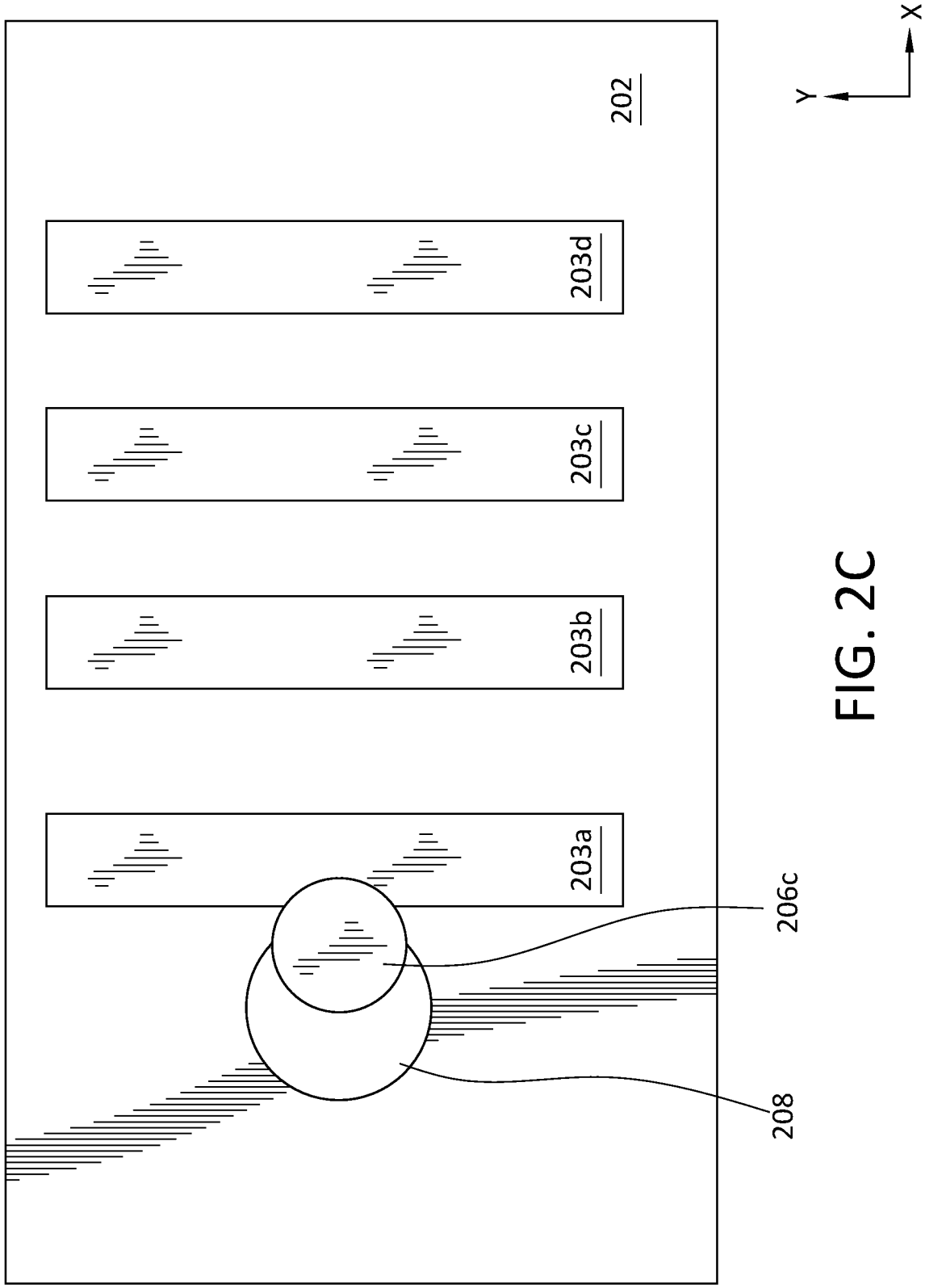
FIG. 2C is a top view of a portion of an inner signal-trace layer of a multi-layer PCB having an insulating layer with signal traces disposed thereon, as shown in FIG. 2A, and further shows a backdrill at the extreme edge of its registration range and extending beyond the backdrill clearance region.

FIG. 2C illustrates PCB 202 and signal traces 203a, 203b, 203c, and 203d, as shown in FIG. 2A, and further shows a backdrill 206c, and backdrill clearance region 208. In the case illustrated in FIG. 2C, backdrill 206c is at the limit of its registration and an inappropriate (too small) clearance has been provided. Because backdrill clearance region 208 is too small to accommodate the full registration range of backdrill 206c, the backdrill 206c comes into contact with signal trace 203a, and removes a portion thereof. Unfortunately, removing a portion of signal trace 203a (as illustrated in FIG. 2D) may adversely affect the electrical properties of signal trace 203a.

Figure 2D:
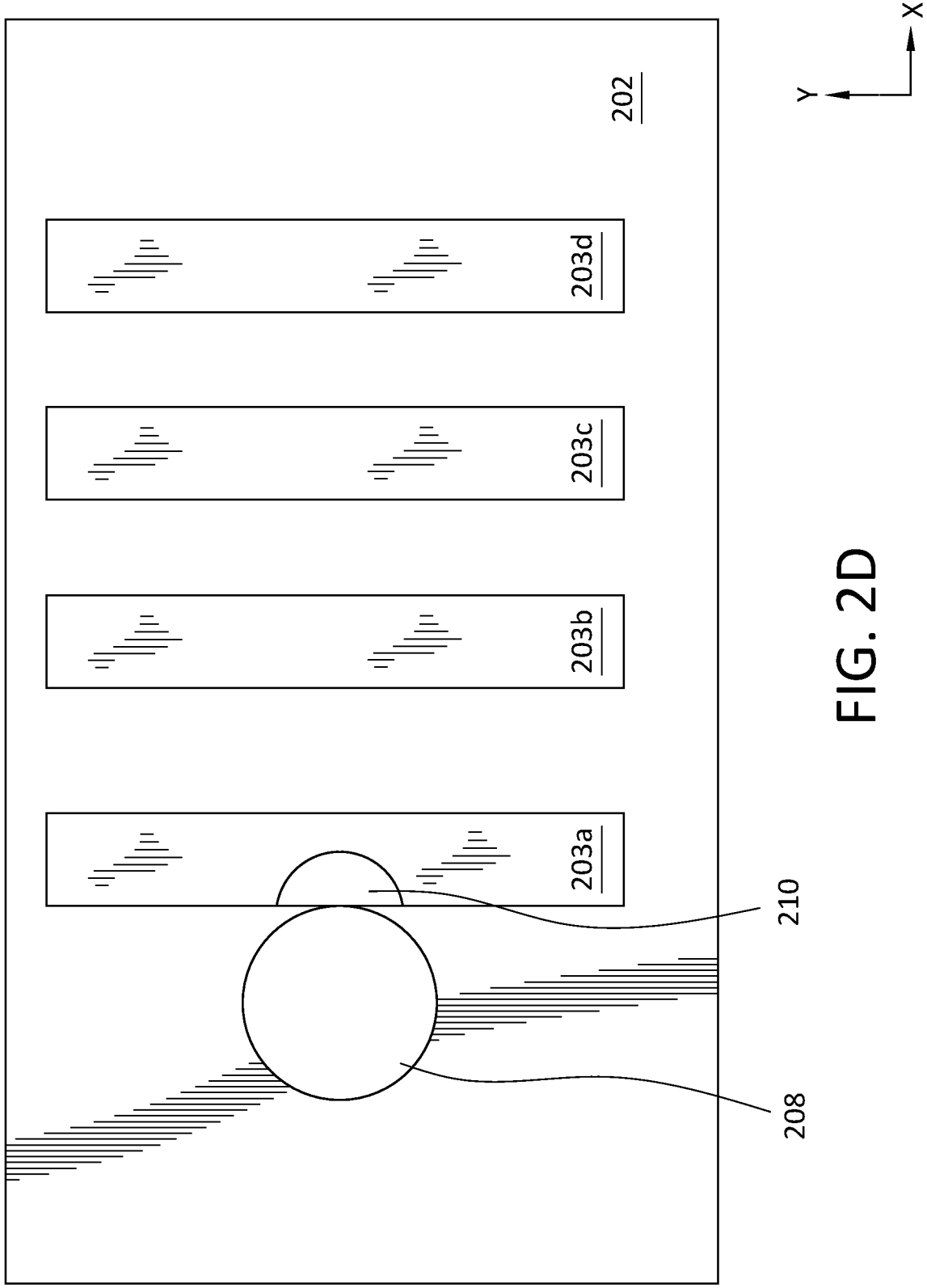
FIG. 2D is a top view of a portion of an inner signal-trace layer of a multi-layer PCB having a backdrill clearance region, and several signal traces disposed on an insulating layer, where the signal trace nearest to the backdrill clearance region has been damaged by backdrilling.

FIG. 2D illustrates PCB 202, and signal traces 203a, 203b, 203c, and 203d, as shown in FIG. 2C, and further shows backdrill clearance region 208, plus a region 210 where a portion of signal trace 203a has been removed. As a result, the signal trace 203a has lost a portion of its width, and the edge of signal trace 203a is now exposed in the backdrilled shaft. Modification of a feature's dimensions in this way is generally unacceptable for features like signal traces, so design rules are typically set to maintain the appropriate size for backdrill clearance regions.

FIGS. 3A-3D show various cases of a voltage-plane layer of a multi-layer PCB, which has been perforated with backdrills. In operation, such voltage planes are typically connected to a power supply node, for example, a ground node or a positive supply voltage node. The voltage planes may, depending on their use in operation, be referred to as conductive planes, power planes, ground planes, reference planes, and so on. It will be appreciated that the thickness of the copper web may be chosen by a designer, however embodiments of this disclosure may work with a wide range of copper web thicknesses. For example, various embodiments of multi-layer PCBs in accordance with this disclosure have inner layers that commonly have a thickness of about 17.5 microns (which may also be described as about 0.7 mils, or about 0.5 oz.), and an outer layer that may commonly have a thickness of about 35 microns (which may also be described as about 1.4 mils, or about 1 oz.). By way of example, and not limitation, other embodiments in accordance with this disclosure may have copper web thicknesses in a range from about 0.5 to about 4.0 oz. for inner layers, and about 1.0 to about 20.0 oz. for outer layers (i.e., surface layers).

Figure 3A:
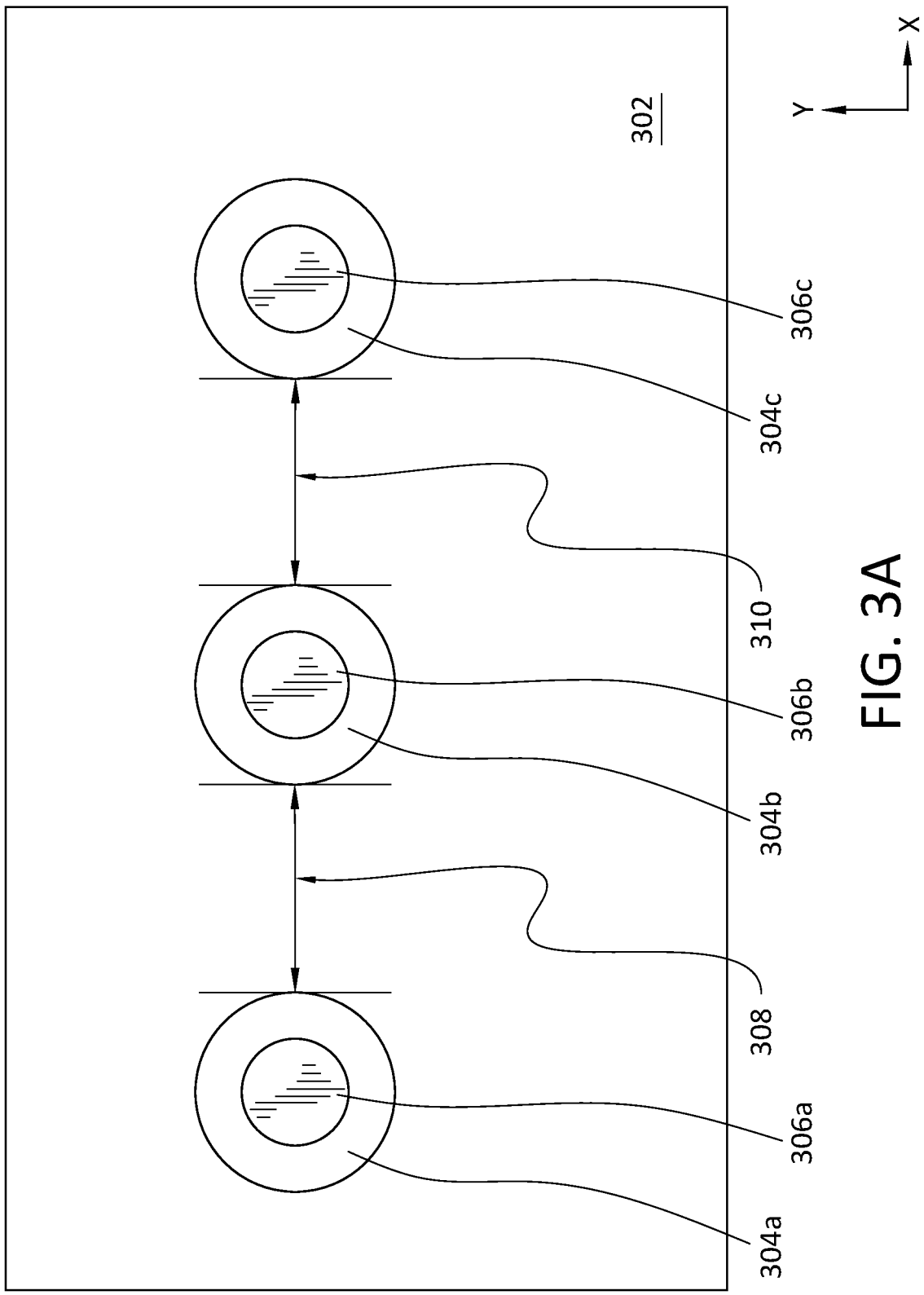
FIG. 3A is a top view of a portion of a voltage plane of a multi-layer PCB having a copper web with openings therein having a diameter set by the dimensions of the backdrill clearance regions, and backdrills centered within the backdrill clearance regions.

FIG. 3A shows a portion of a voltage plane 302, such as a ground plane or positive voltage supply plane, at one inner layer of a multi-layer PCB. In this example, the electrically conductive voltage plane 302 is a copper web. FIG. 3A also shows backdrill clearance regions 304a, 304b, and 304c; and further shows backdrills 306a, 306b, and 306c, each nominally centered within corresponding backdrill clearance regions 304a, 304b, and 304c. These backdrill clearance regions define the width of the remaining copper web (i.e., voltage plane 302). Also shown are a distance 308 between backdrill clearance region 304a and backdrill clearance region 304b, and a distance 310 between backdrill clearance region 304b and backdrill clearance region 304c.

Figure 3B:
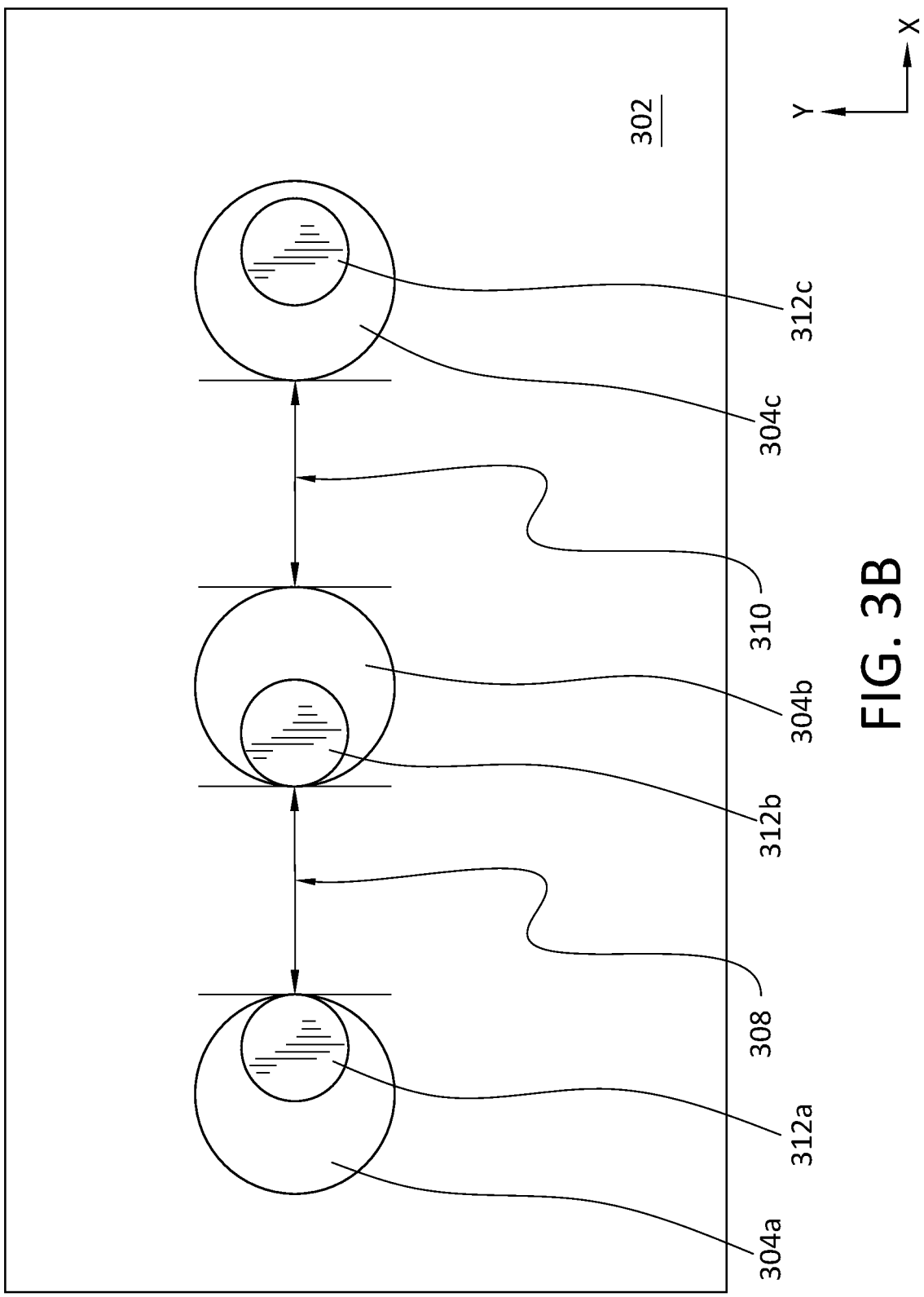
FIG. 3B is a top view of a portion of a voltage plane of a multi-layer PCB having a copper web with openings therein having a diameter set by the dimensions of the backdrill clearance regions, backdrill clearance regions and backdrills off-center but within the backdrill clearance regions.

FIG. 3B shows a portion of a voltage plane 302, such as a ground plane or positive voltage supply plane, at one layer of a multi-layer PCB. FIG. 3B also shows backdrill clearance regions 304a, 304b, and 304c; and further shows backdrill 312a misregistered to the right, backdrill 312b misregistered to the left, and back drill 312c misregistered down and to the right, all with respect to their corresponding backdrill clearance regions 304a, 304b, and 304c. Also shown are the distance 308 between backdrill clearance region 304a and backdrill clearance region 304b, and the distance 310 between backdrill clearance region 304b and backdrill clearance region 304c. Note that the backdrill does not contact the voltage plane or change its shape even in the instance of worst case registration shown here.

Taken together, FIGS. 3A-3B illustrate that the shape of the copper web, having appropriately sized backdrill clearance regions, is fixed independent of the backdrill registration.

Unlike FIGS. 3A-3B, FIGS. 3C-3D illustrate that the shape of the copper web is not fixed and independent of backdrill registration. Rather, in this case the backdrill itself defines the remaining copper web, which is consequently significantly wider than the case where a backdrill clearance region (i.e., anti-pad) has been provided.

FIG. 3C, like FIGS. 3A and 3B, shows a portion of a voltage plane 302. FIG. 3C also shows backdrills 306a, 306b, and 306c. Note that there are no backdrill clearance regions, and backdrills 306a, 306b, and 306c are aligned with respect to each other as they are in FIG. 3A. A distance 314 between backdrill 306a and backdrill 306b is shown. And, a distance 316 between backdrill 306b and backdrill 306c is also shown. By comparing FIG. 3C to FIG. 3A, it can be seen that distance 314 is greater than distance 308, and distance 316 is greater than distance 310. This is because backdrill clearance regions 304a, 304b, and 304c of voltage plane 302 have been removed in accordance with this disclosure. Consequently, voltage plane 302 has a greater amount of conductive area. In turn, the electrical performance of voltage plane 302 as a power plane, ground plane, or reference plane is improved as a result of having the greater amount of conductive area mentioned above.

Figure 3D:
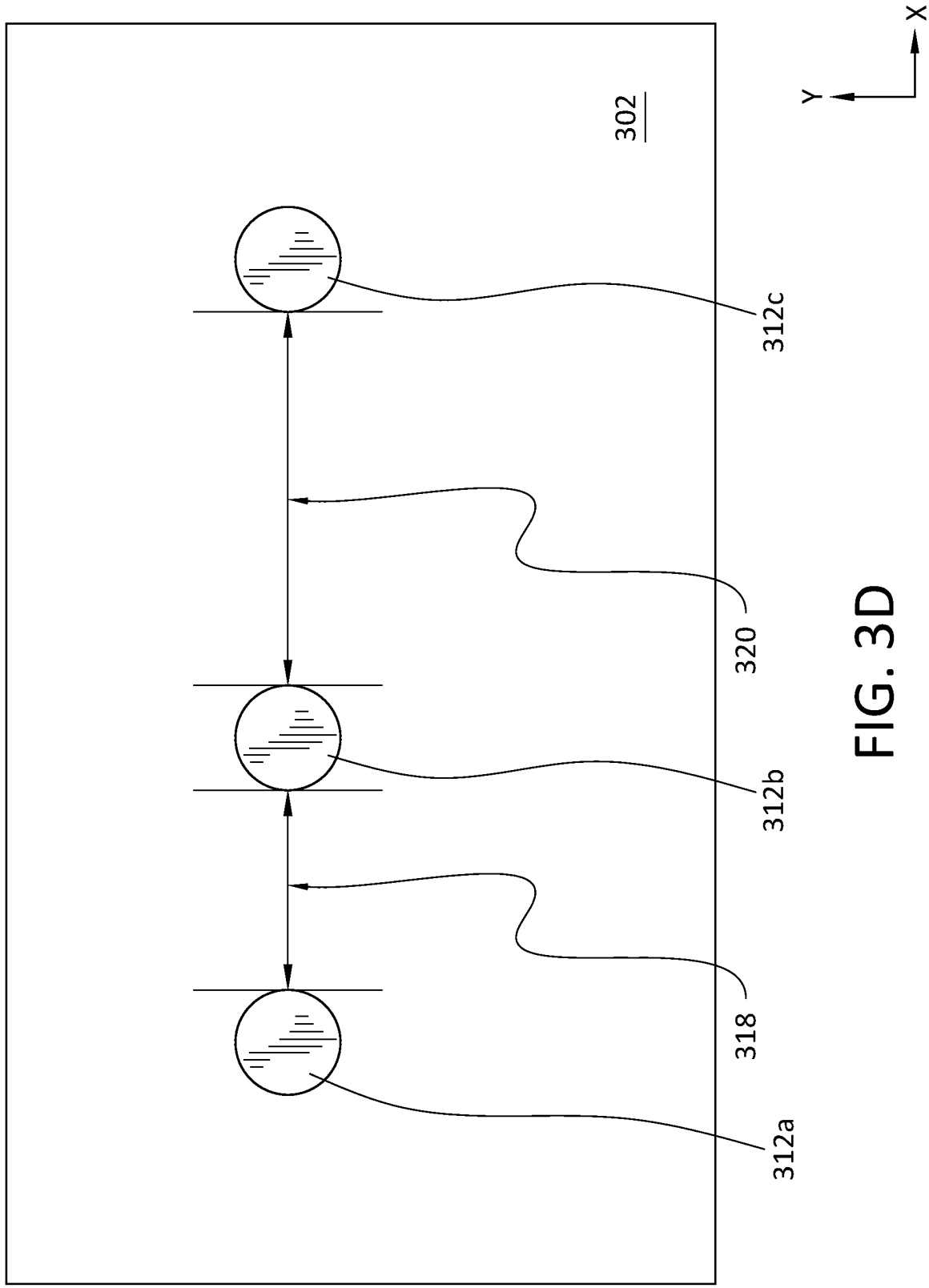
FIG. 3D is a top view of a portion of a voltage plane of a multi-layer PCB having a copper web without backdrill clearance regions, and unevenly spaced-apart backdrills, in accordance with this disclosure.

FIG. 3D, like FIGS. 3A-3C, shows a portion of voltage plane 302. FIG. 3D shows backdrills 312a, 312b and 312c. Note that there are no backdrill clearance regions, and backdrills 312a, 312b, and 312c are aligned with respect to each other as they are in FIG. 3B (i.e., misregistered with respect to their intended nominal center points). A distance 318 between backdrill 312a and backdrill 312b is shown. And, a distance 320 between backdrill 312b and backdrill 312c is also shown. By comparing FIG. 3D to FIG. 3B, it can be seen that distance 318 is greater than distance 308, and distance 320 is greater than distance 310. This is because backdrill clearance regions 304a, 304b, and 304c of voltage plane 302 have been removed in accordance with this disclosure.

Still referring to FIG. 3D, an extreme case of opposing backdrill misregistration is shown. But, an extreme case of backdrill misregistration may be unlikely because misregistration often has a systemic bias. Nevertheless, it is noted that even in the case of opposing misregistration, the average copper web width of voltage plane 302 would remain the same and would in no instance fall below that of voltage planes using traditional backdrill clearance regions.

FIGS. 4A-4D show the voltage plane, backdrill clearance regions, and backdrill arrangements of FIGS. 3A-3D respectively, and further provide a superimposed illustration of signal traces on a different inner layer than the one on which the voltage plane resides.

Figure 4A:
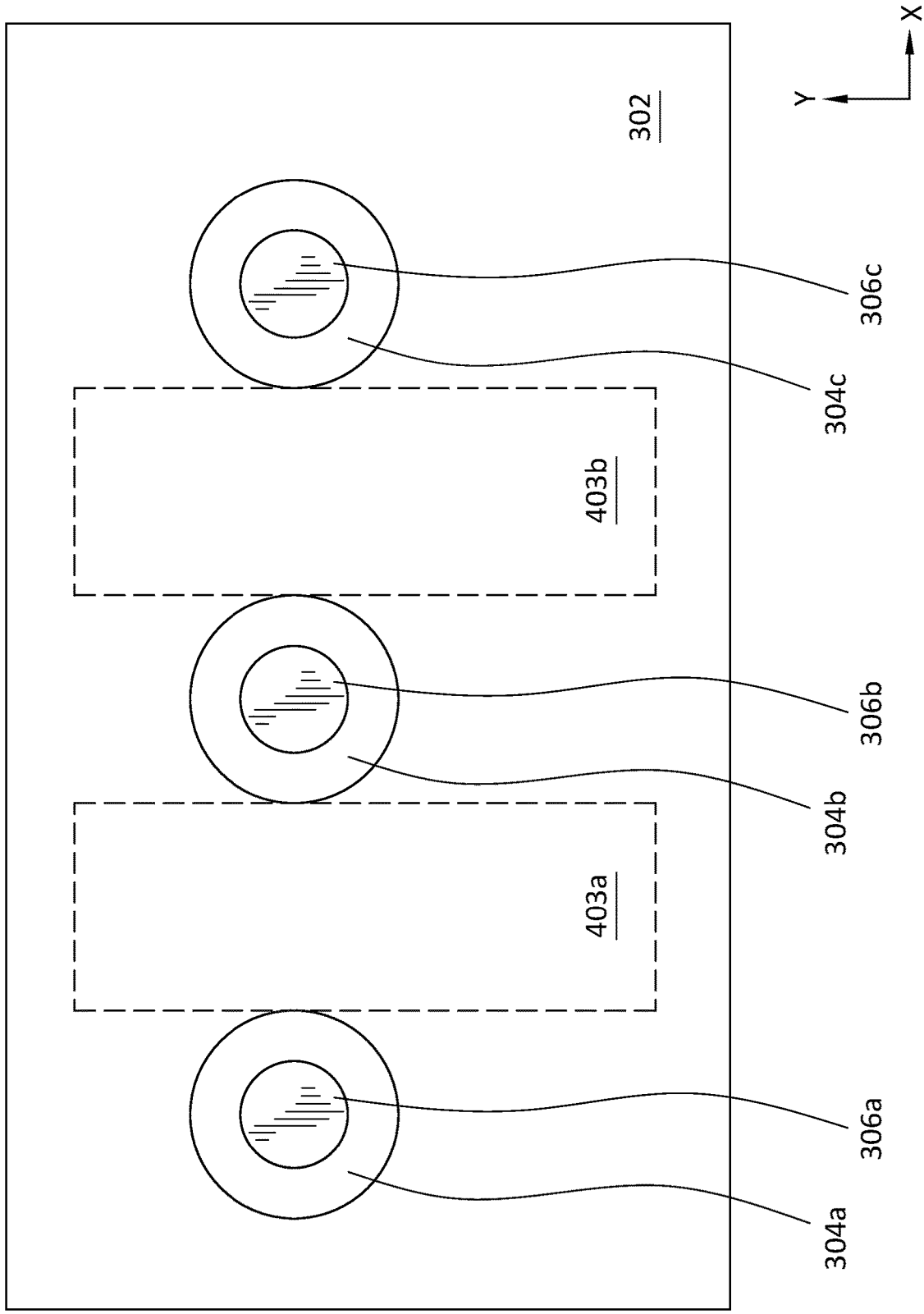
FIG. 4A is a top view of a portion of a multi-layer PCB showing signal traces superimposed on top of the voltage plane of FIG. 3A.

FIG. 4A is a top view of a portion of a multi-layer PCB showing signal traces superimposed on top of the voltage plane of FIG. 3A. FIG. 4A includes a portion of voltage plane 302, such as a ground plane, reference plane, or positive voltage supply plane, at one inner layer of the multi-layer PCB. The illustrated electrically conductive voltage plane 302 is a copper web. FIG. 4A also shows backdrill clearance regions 304a, 304b, and 304c; and further shows backdrills 306a, 306b, and 306c, each nominally centered within corresponding backdrill clearance regions 304a, 304b, and 304c. These backdrill clearance regions essentially define the width of the remaining copper web (i.e., voltage plane 302). Also shown are a first signal trace 403a, and a second signal trace 403b. The perimeters of first and second signal traces 403a and 403b are shown with dashed lines to indicate that first and second signal traces 403a and 403b are on an inner layer of the multi-layer PCB that is vertically offset from the inner layer on which voltage plane 302 is disposed.

In the illustration of FIG. 4A, first signal trace 403a and second signal trace 403b are each disposed such that a 1:1 overlap configuration is achieved between each signal trace and the underlying voltage plane 302, which in this example serves as a reference plane. It is noted that in this illustration the signal traces are properly aligned, that is, registered, with the backdrill clearance regions of the underlying voltage plane 302.

Figure 4B:
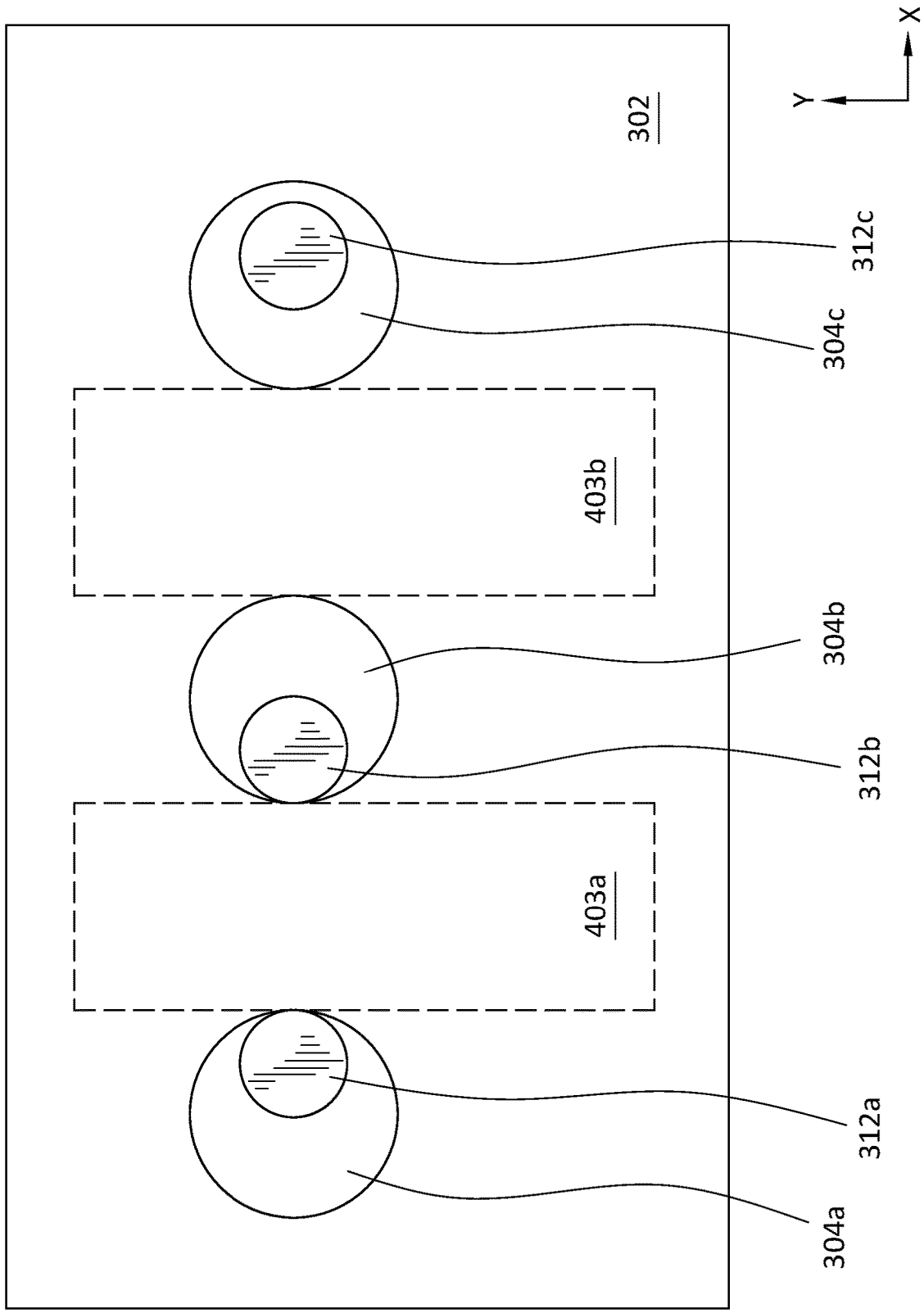
FIG. 4B is a top view of a portion of a multi-layer PCB showing signal traces superimposed on top of the voltage plane of FIG. 3B.

FIG. 4B is a top view of a portion of a multi-layer PCB showing signal traces superimposed on top of the voltage plane of FIG. 3B. FIG. 4B includes a portion of voltage plane 302, such as a ground plane, reference plane, or positive voltage supply plane, at one inner layer of a multi-layer PCB. The illustrated electrically conductive voltage plane 302 is a copper web. FIG. 4B also shows backdrill clearance regions 304a, 304b, and 304c; and FIG. 4B further shows backdrills 312a misregistered to the right, backdrill 312b misregistered to the left, and back drill 312c misregistered down and to the right, with respect to their corresponding backdrill clearance regions 304a, 304b, and 304c. Backdrill clearance regions 304a, 304b, and 304c define the width of the remaining copper web (i.e., voltage plane 302). Also shown are first signal trace 403a, and second signal trace 403b. The perimeters of first and second signal traces 403a and 403b are shown with dashed lines to indicate that first and second signal traces 403a and 403b are on an inner layer of the multi-layer PCB that is vertically offset from the inner layer on which voltage plane 302 is disposed.

Still referring to FIG. 4B, it can be seen that even though backdrills 312a, 312b, and 312c are misregistered with respect to the centers of their corresponding backdrill clearance regions 304a, 304b, and 304c, there is still a 1:1 overlap between each signal trace and a corresponding portion of the underlying copper web (i.e., voltage plane 302). As noted above in connection with FIG. 4A, in this illustration the signal traces are properly aligned, that is, registered, with the backdrill clearance regions of the underlying voltage plane 302.

Figure 4C:
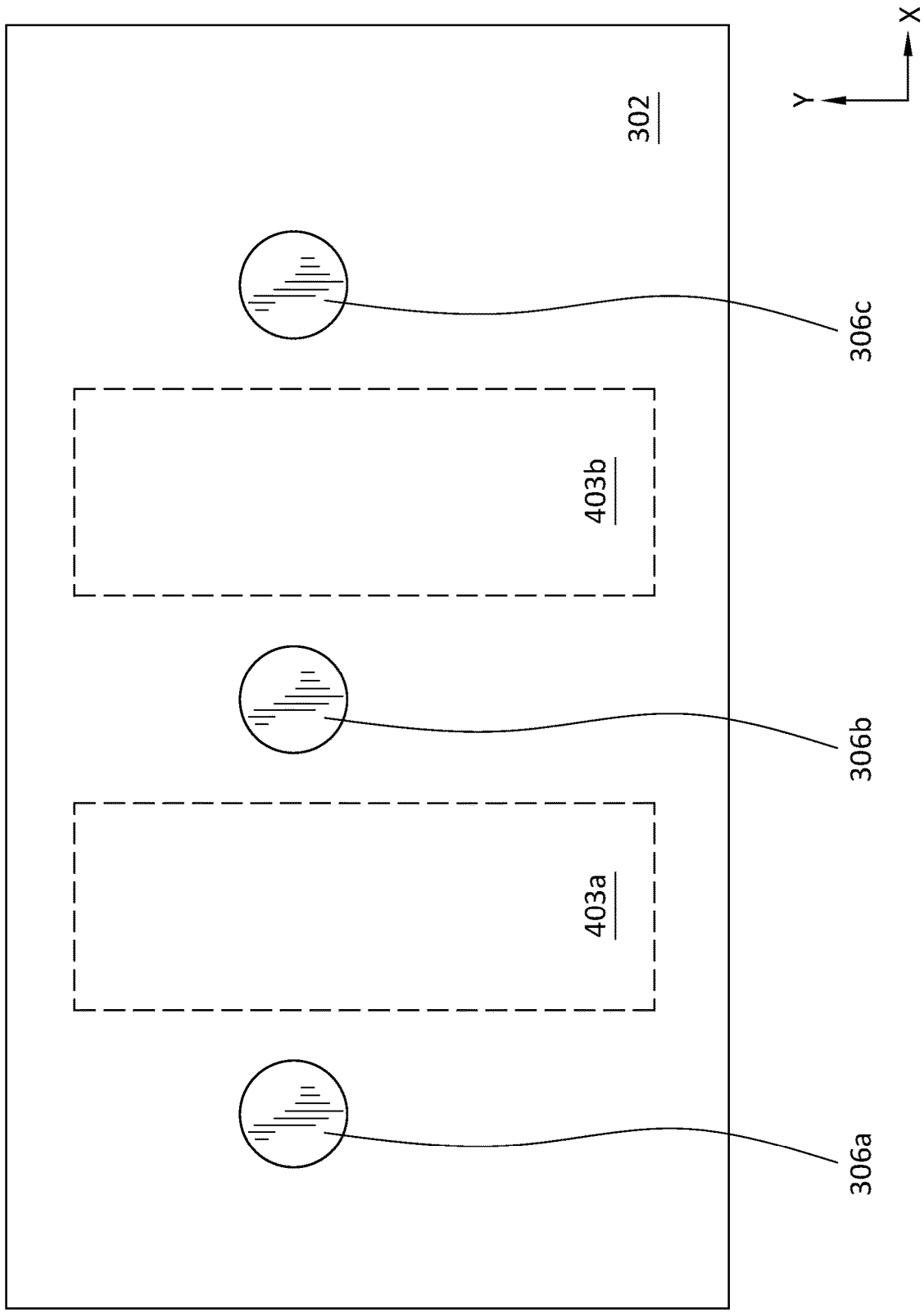
FIG. 4C is a top view of a portion of a multi-layer PCB showing signal traces superimposed on top of the voltage plane of FIG. 3C, in accordance with this disclosure.
Figure 4D:
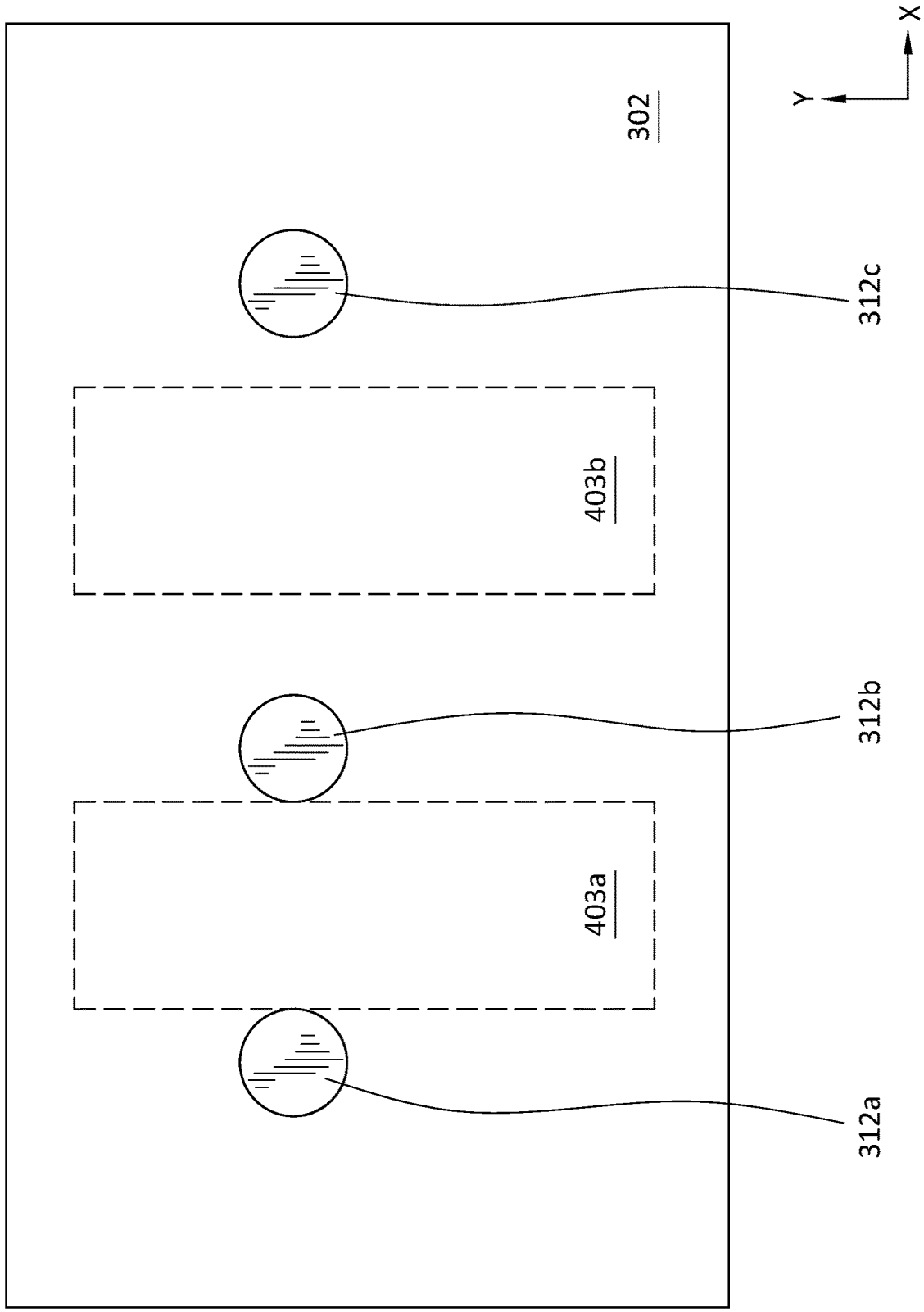
FIG. 4D is a top view of a portion of a multi-layer PCB showing signal traces superimposed on top of the voltage plane of FIG. 3D, in accordance with this disclosure.

FIGS. 4C-4D are similar to the illustrations of FIGS. 4A-4B, except the backdrill clearance regions have been eliminated in accordance with this disclosure. As discussed below, the overlap between the signal traces and the underlying voltage plane is at least the same as, or in many cases better than, the overlap that can be obtained when using backdrill clearance regions.

FIG. 4C is a top view of a portion of a multi-layer PCB showing signal traces 403a and 403b, superimposed on top of the voltage plane of FIG. 3C, in accordance with this disclosure. FIG. 4C shows backdrills 306a, 306b, and 306c aligned with respect to each other as they are in FIG. 3C. As can be seen by comparing FIG. 4C to FIG. 4A, signal traces 403a and 403b, have greater than a 1:1 relationship with voltage plane 302. In other words, the relationship of signal traces 403a and 403b, to their reference plane (i.e., voltage plane 302) is better because the copper is wider without the backdrill clearance regions.

FIG. 4D is a top view of a portion of a multi-layer PCB showing signal traces superimposed on top of the voltage plane of FIG. 3D, in accordance with this disclosure. FIG. 4D illustrates that even when there is misregistration of the backdrills, the relationship between the signal traces and their reference plane is as good as (see signal trace 403a) or better than (see signal trace 403b) the arrangement of FIG. 4B where the backdrill clearance regions have been left in place.

Figure 5A:
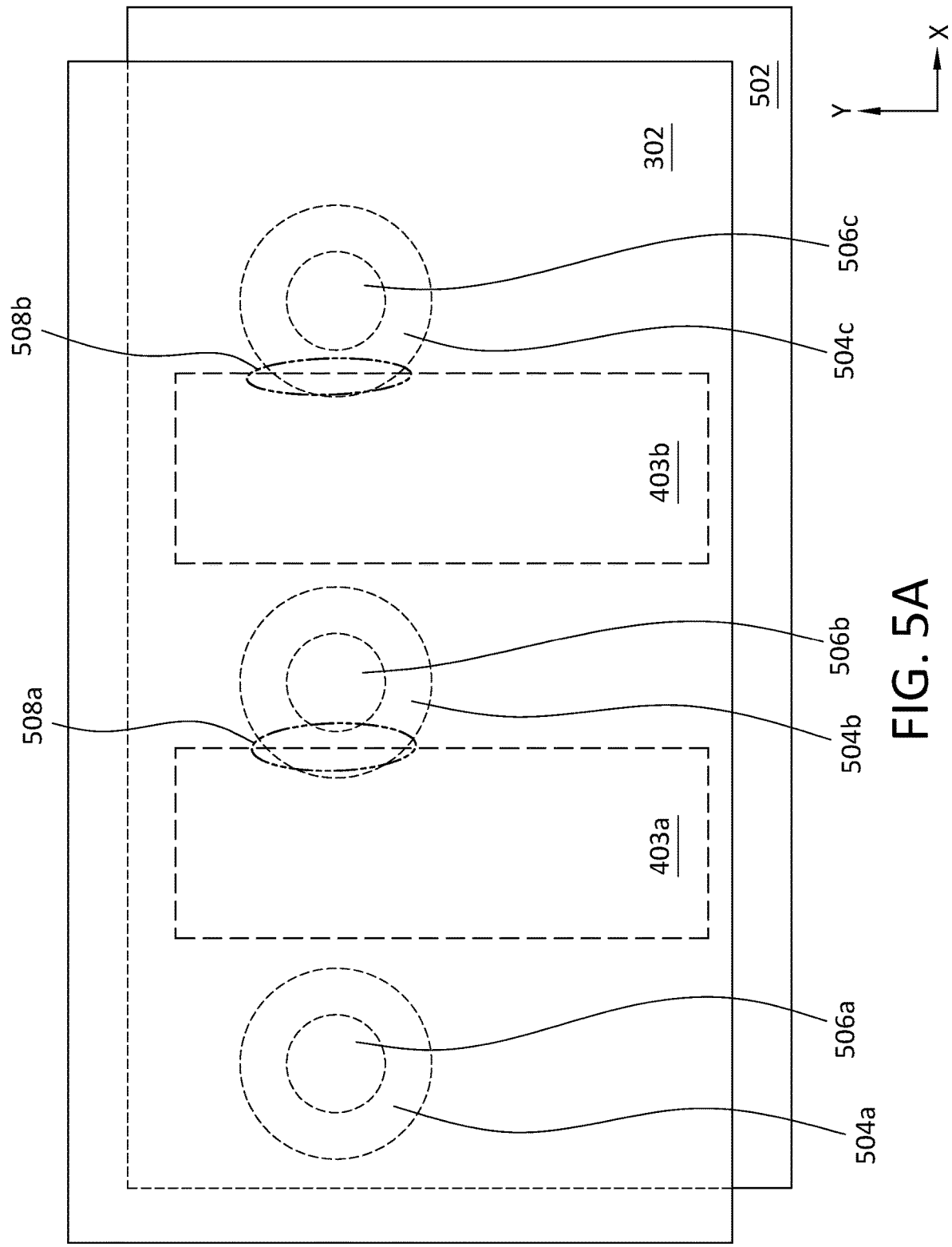
FIG. 5A is a top view of a portion of a multi-layer PCB showing a misregistered signal-trace layer superimposed on top of the voltage plane of FIG. 3A.

FIG. 5A is a top view of a portion of a multi-layer PCB showing a misregistered signal-trace layer 502 superimposed on top of voltage plane 302. Also shown are backdrill clearance regions 504a, 504b, and 504c, and backdrills 506a, 506b, and 506c, nominally centered within their respective backdrill clearance regions. Further, FIG. 5A identifies two areas 508a and 508b where portions of signal traces 403a and 403b are vertically aligned with portions of backdrill clearance regions 504b and 504c respectively. Because of the misregistration between signal-trace layer 502 and the layer of voltage plane 302, the identified portions of signal traces 403a and 403b are "dereferenced." Such dereferencing has proven to be highly problematic for signal integrity at high signal speeds.

Referring to FIG. 4A and FIG. 5A, it can be seen that misregistration between layers can result in a situation where a signal trace fails to achieve at least a 1:1 overlap relationship with its underlying reference plane where the signal trace overlaps a backdrill clearance region. More particularly, even though signal traces 403a and 403b in FIG. 4A are able to have a 1:1 overlap relationship with the underlying voltage plane 302 when backdrill clearance regions are present, this configuration does not take into account layer-to-layer misregistration, and thus may fail when layer-to-layer misregistration is taken into account. FIG. 5A illustrates that by taking layer-to-layer misregistration into account, localized dereferencing can occur.

Figure 5B:
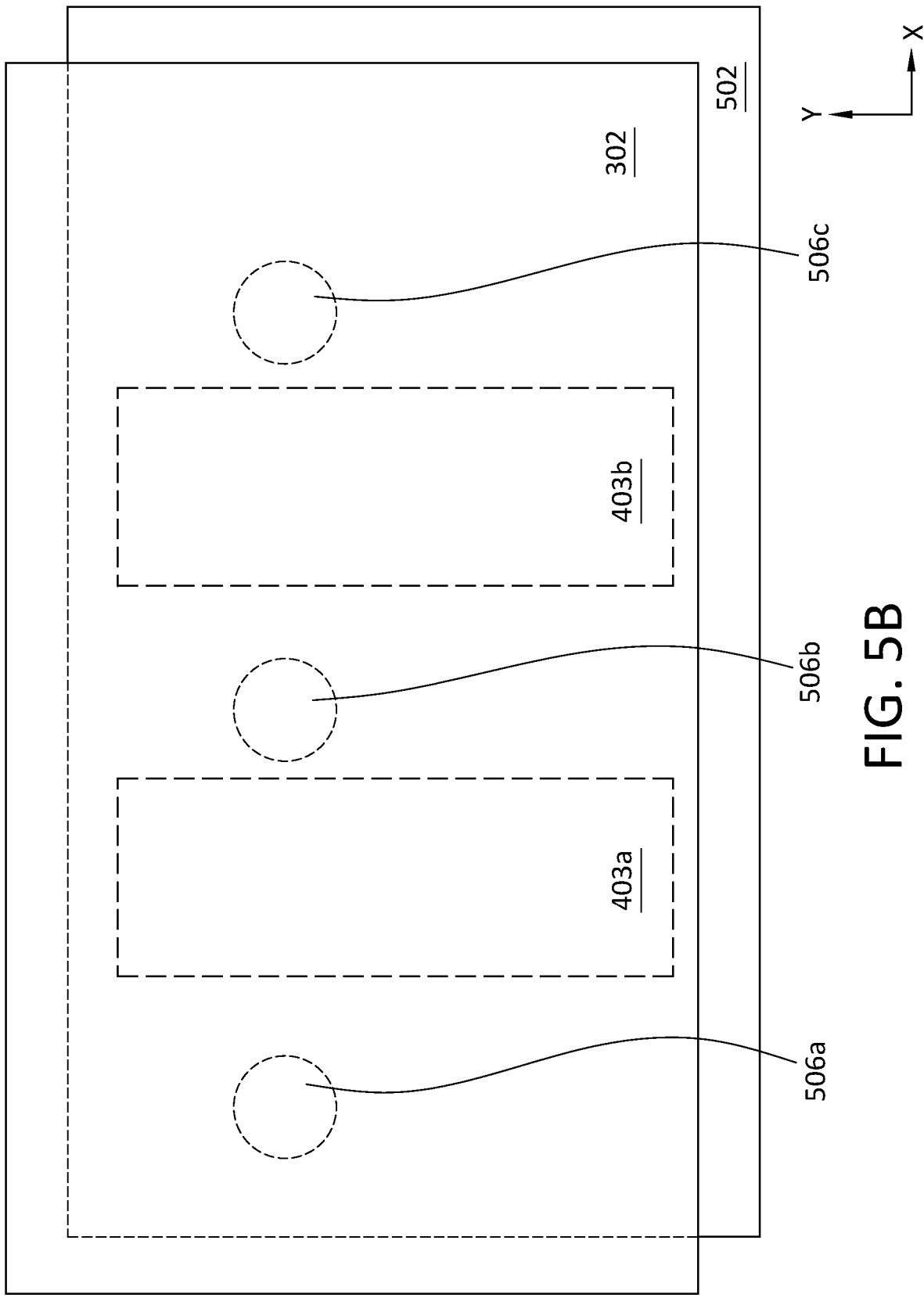
FIG. 5B is a top view of a portion of a multi-layer PCB showing a misregistered signal-trace layer superimposed on top of the voltage plane of FIG. 3D, in accordance with this disclosure.

FIG. 5B is a top view of a portion of a multi-layer PCB showing a misregistered signal-trace layer 502 superimposed on top of the voltage plane of FIG. 3D, in accordance with this disclosure. That is, backdrill clearance regions have been removed thereby overcoming the localized dereferencing problem illustrated in FIG. 5A.

Figure 6A:
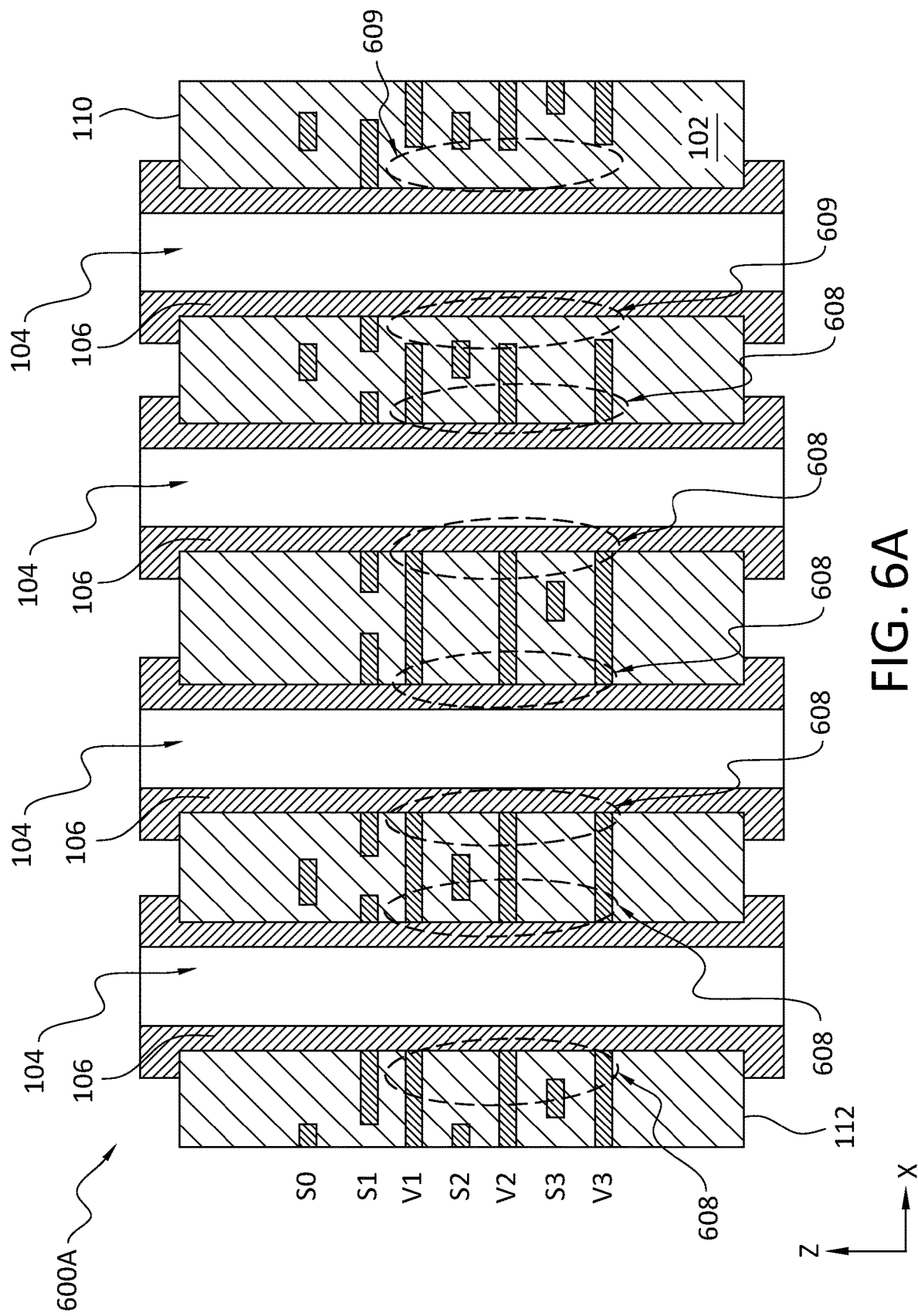
FIG. 6A is a cross-sectional view of an illustrative multi-layer PCB prior to backdrilling, in accordance with this disclosure.

FIG. 6A is a cross-sectional view of an illustrative multi-layer PCB 600A prior to backdrilling, in accordance with this disclosure. FIG. 6A shows a PCB substrate material 102, a plurality of plated-through-hole vias 104 and their corresponding conductive barrels 106, a top surface 110 of the PCB and a bottom surface 112. FIG. 6A further shows a layer of signal traces S0, a layer of signal traces S1, a voltage plane V1, a layer of signal traces S2, a voltage plane S2, a layer of signal traces S3, and a voltage plane V3. Multi-layer PCBs in accordance with this disclosure may have more or fewer layers.

Still referring to FIG. 6A, regions 608 adjacent to conductive barrels 106 of plated-through-holes 104 are identified. In accordance with this disclosure, it can be seen that in regions 608 voltage planes V1, V2, and V3 are in contact with conductive barrels 106 of plated-through-holes 104. It can also be seen that, unlike voltage planes V1, V2, and V3, signal traces on corresponding layers of signal traces S0, S2, and S3, are spaced apart from the conductive barrels 106 in regions 608 by an amount consistent with the radius of a backdrill clearance region as measured from a center of the plated-through-hole at the same layer level as the signal trace. Further, regions 609 adjacent to a conductive barrel 106 of a plated-through-hole 104 is identified. It can be seen that in regions 609 voltage planes V1, V2, and V3 are not in contact with the conductive barrel 106, but rather spaced apart from the conductive barrel. In this illustrative embodiment, not every plated-through-hole via will be backdrilled. For those plated-through-hole vias which are not backdrilled, voltage planes V1, V2, and V3 are spaced apart from the conductive barrel, otherwise voltage planes V1, V2, and V3 may be undesirably shorted to such conductive barrels. Still referring to those plated-through-hole vias which are not backdrilled, typically, voltage planes V1, V2, and V3 would be spaced apart from those conductive barrels by an amount consistent with the dimensions of the backdrill clearance region, since this is the separation distance typically assigned during the PCB design stage. In alternative embodiments, the spacing between a voltage plane and a conductive barrel that is not to be backdrilled can be based on the minimum achievable copper-to-copper spacing without shorts (determined by patterning and etching resolution of a manufacturer) of any particular PCB manufacturing process. In this way, PCB design software, or computer-aided-design (CAD) tools, may be able to use information about whether and to what extent a conductive barrel will be backdrilled, to assign spacing between a conductor and a conductive barrel. By knowing that a conductive barrel, or at least a portion thereof, will not be backdrilled, the minimum spacing between a conductor and a conductive barrel need not be based on the range of backdrill misregistration.

Figure 6B:
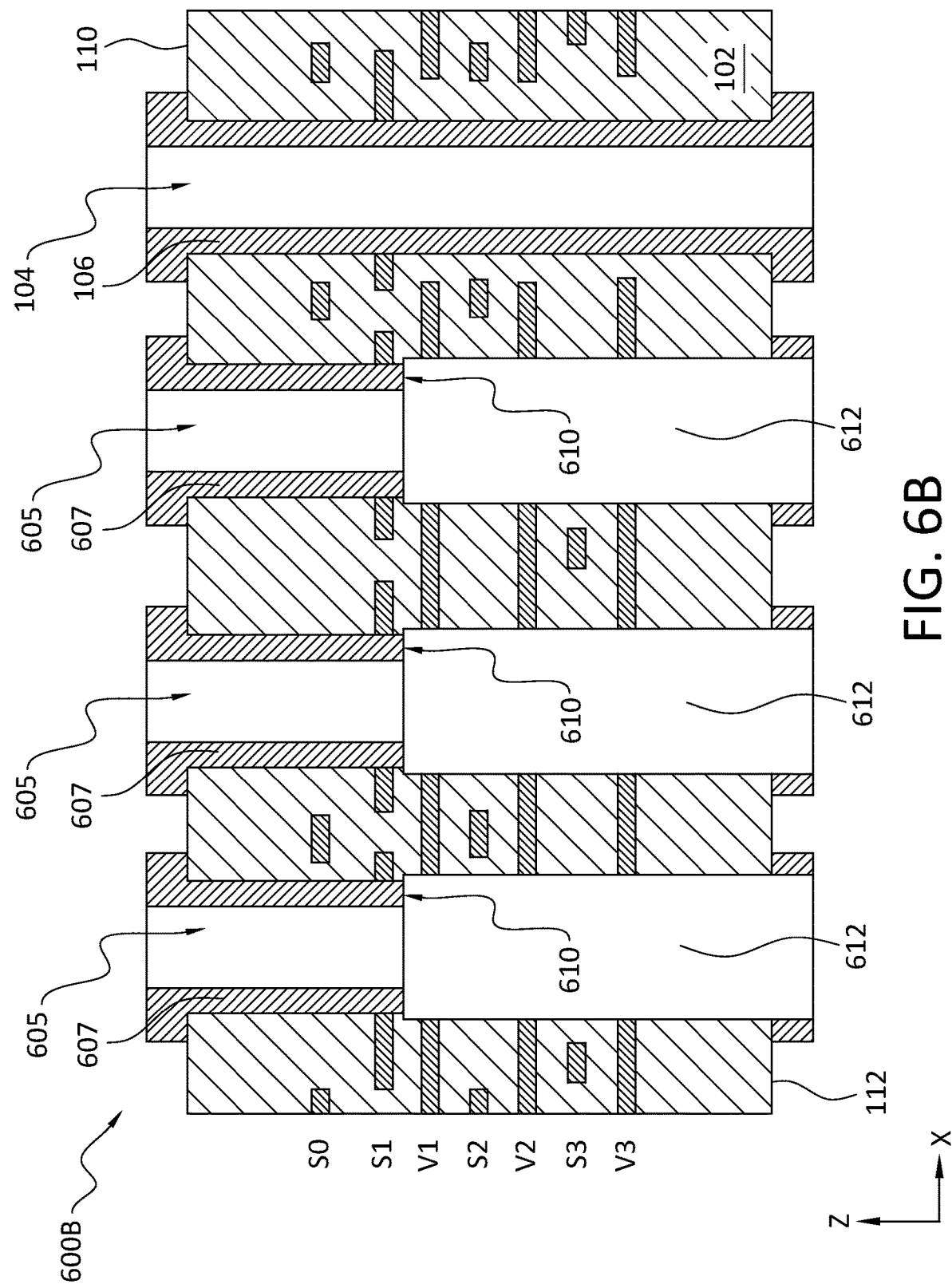
FIG. 6B is a cross-sectional view of the illustrative multi-layer PCB after backdrilling, in accordance with this disclosure.

FIG. 6B is a cross-sectional view of an illustrative multi-layer PCB 600B. Multi-layer PCB 600B shows multi-layer PCB 600A after backdrilling, in accordance with this disclosure. FIG. 6B shows a plurality of backdrill shafts 612. Backdrill shafts 612 have a diameter greater than the diameter of a plated-through-hole via, and less than the diameter of a backdrill clearance region.

Still referring to FIG. 6B, it can be seen that after backdrilling, plated-through-hole via 104 has conductive barrel 106 that extends vertically from a first outer surface 110 of the multi-layer PCB to a second outer surface 112 of the multi-layer PCB. Further, plated-through-hole vias 605 have conductive barrels 607 that extend from first outer surface 110 to a conductive barrel inner end 610 located within the multi-layer PCB, and corresponding backdrilled shafts 612 that extend from the conductive barrel inner end 610 to second outer surface 112.

Figure 6C:
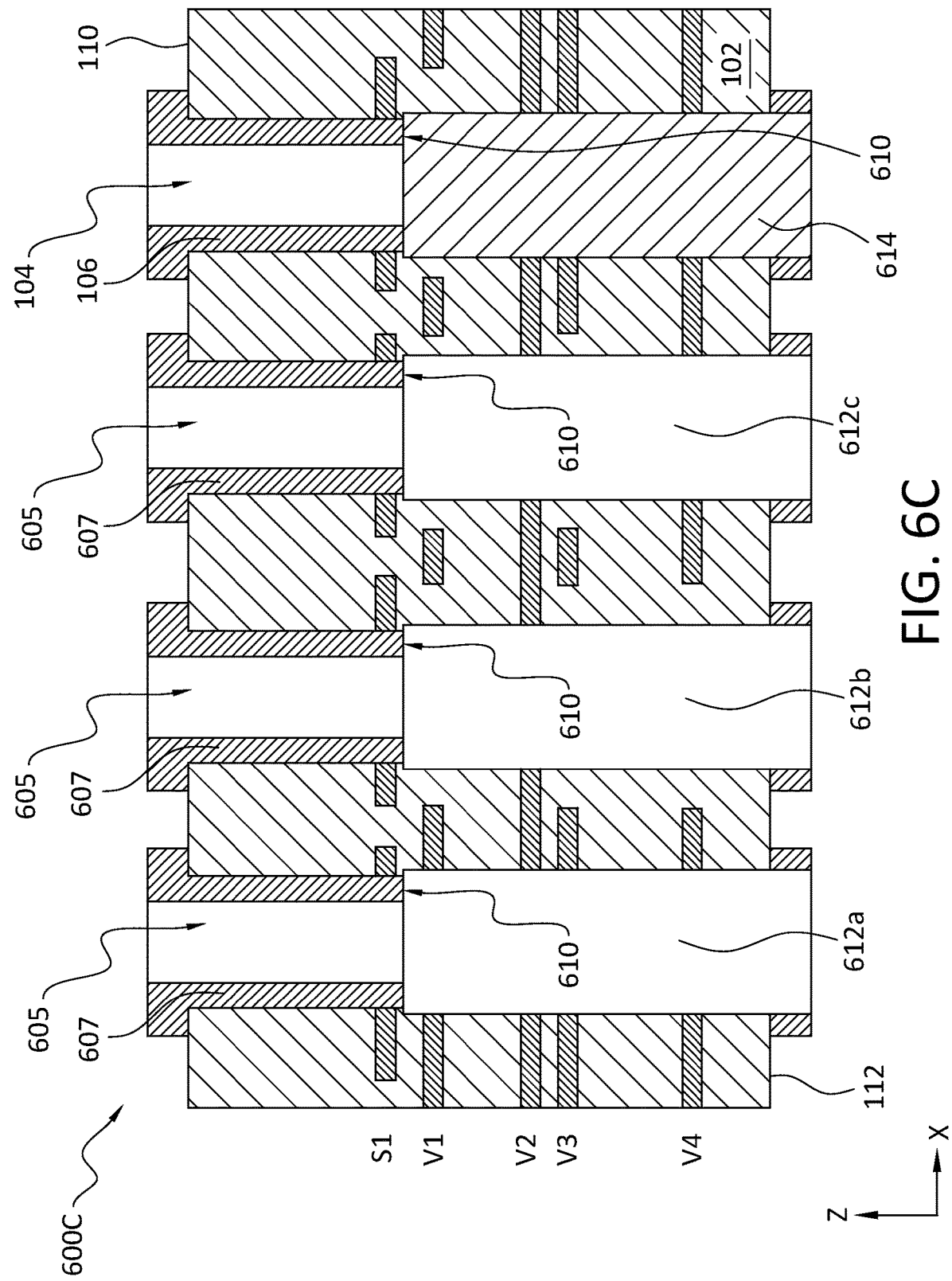
FIG. 6C is a cross-sectional view of another illustrative embodiment after backdrilling, in accordance with this disclosure.

FIG. 6C is a cross-sectional view of another illustrative multi-layer PCB 600C after backdrilling, in accordance with this disclosure. Multi-layer PCB 600C includes a PCB substrate material 102, a plated-through-hole via 104 and its corresponding conductive barrel 106, a top surface 110 of the PCB and a bottom surface 112 of the PCB. FIG. 6C further shows a plurality of plated-through-hole vias 605 that have been backdrilled. FIG. 6C also shows signal traces on signal-trace layer S1 that are in contact with conductive barrels 607.

In this illustrative embodiment, portions of conductive barrels below signal traces on signal-trace layer S1 have been removed by backdrilling. This is done to reduce or eliminate via stubs that adversely affect signal integrity. Plated-through-hole vias 605 each have a corresponding conductive barrel 607 that has been shortened by backdrilling. Conductive barrels 607 extend from top surface 110 to conductive barrel inner end 610. The conductive barrel inner end 610 is located just below the signal-trace layer S1. Backdrill shafts 612a, 612b, and 612c occupy the space under the shortened plated-through-hole vias 605 from conductive barrel inner ends 610 to the bottom surface 112, as shown.

Still referring to FIG. 6C, the case where backdrill clearance regions are removed on all voltage-plane layers V1, V2, V3, and V4 regardless of potential can be seen at backdrill shaft 612a. Here the close vertical proximity of V1 to the signal via S1 and of voltage-plane layers V2 to V3 create a risk of shorting given that these are all at different potentials. At backdrill shaft 612b, the result of removing backdrill clearance regions in accordance with this disclosure can be seen. That is, backdrill clearance regions have been removed only on voltage-plane layer V2, thus there is no risk of a short to voltage-plane layer V3. And, voltage-plane layer V2 is sufficiently far away from V1 that there is no significant risk of a short there either. At backdrill shaft 612c, the case where more aggressive design rules, in accordance with this disclosure, allow for the possibility of two or more voltage-planes layers of different potential to have their clearances removed is shown. In this case, voltage-plane layer V4 is deemed to be sufficiently far from voltage-plane layer V2, and voltage-plane layer V2 is sufficiently far from conductive barrel inner ends 610, which are connected to S1, that there is no reasonable risk of a short between those either. In some cases, in accordance with this disclosure, a backdrill shaft may be filled with a non-conductive filler material 614 thereby allowing voltage-plane layers V2 and V3 to have their clearances removed despite their close vertical spacing. In alternative embodiments, a non-conductive material may be disposed in a backdrill shaft without completely filling that backdrill shaft.

Figures 7A, 7B:
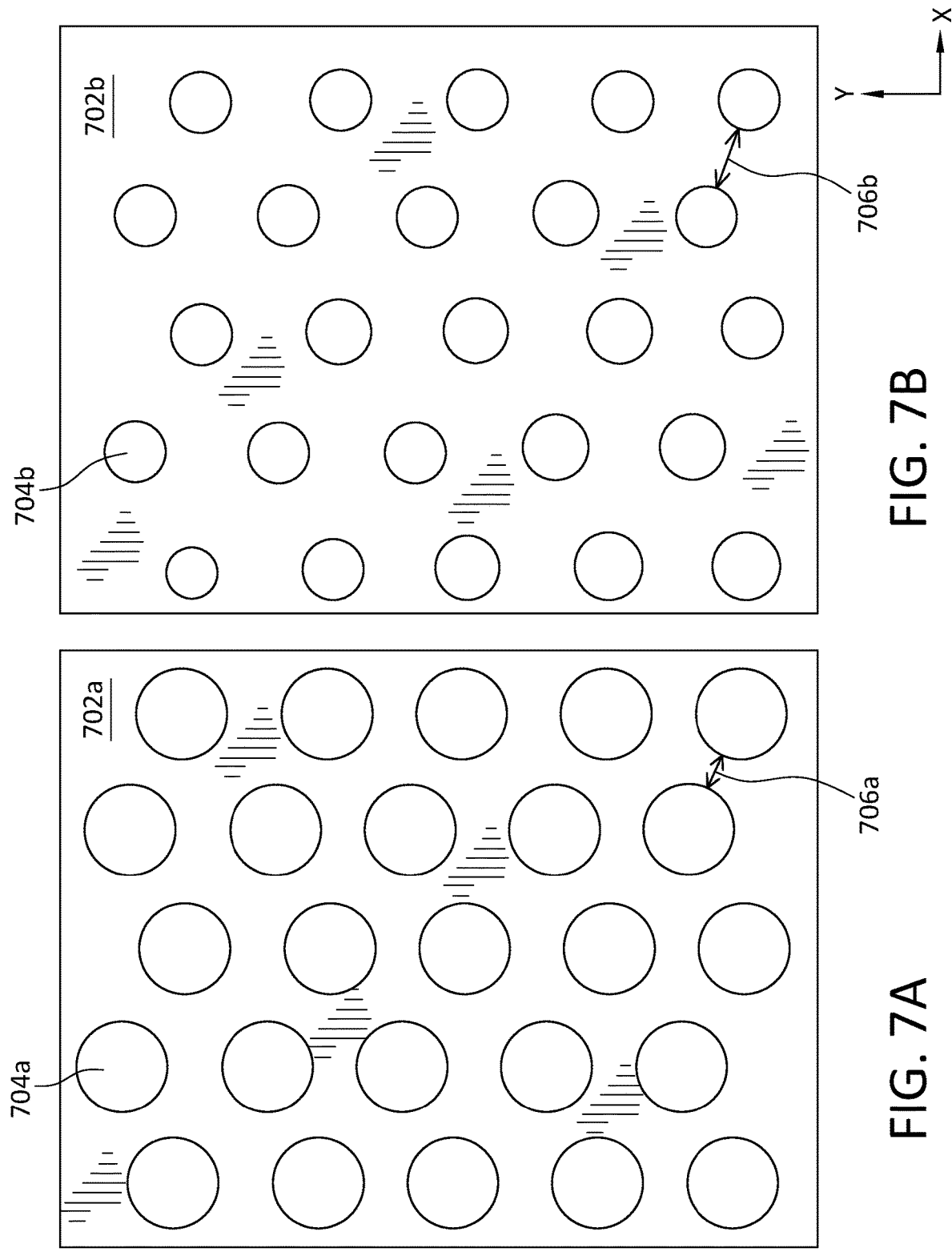
FIG. 7A is a top view of a portion of a copper plane, on an inner layer of a multi-layer PCB, having openings the size of which are determined by the size of the backdrill clearance region.
FIG. 7B is a top view a portion of a copper plane, on an inner layer of a multi-layer PCB, having openings the size of which are determined by the size of the backdrill, in accordance with this disclosure.

In practice, many or all of the layers adjacent to signal layers for which it would be desirable to implement this technique for signal integrity purposes are digital ground layers set to the same potential. However there are applications like that of power delivery, where it is desirable to implement this technique only on power layers to increase the effective width of the web between backdrills to increase the overall current carrying capacity of the plane. FIGS. 7A-7B, described below, illustrate the net effect on the web width (706a versus 706b) after removing these clearances on the overall remaining copper.

FIG. 7A is a top view of a portion of a copper plane 702a, on an inner layer of a multi-layer PCB having holes 704a that correspond to backdrill clearance regions. The size of holes 704a are determined by the size of the backdrill clearance regions.

FIG. 7B is a top view a portion of a copper plane 702b, on an inner layer of a multi-layer PCB, having holes 704b the size of which are determined by the size of the backdrill used to form backdrill shafts, in accordance with this disclosure. In this example, copper plane 702a and copper plane 702b have nominally the same thickness. Because the size of drill bits used to backdrill are smaller than the size of backdrill clearance regions, holes 704b are smaller than holes 704a. Consequently, copper plane 702b has a greater amount of conductive material and a greater area of coverage than copper plane 702a. Thus, copper plane 702b may be advantageous over copper plane 702a because it presents a greater current carrying capacity, and presents a reduced risk of localized dereferencing for signal traces.

Figure 8:
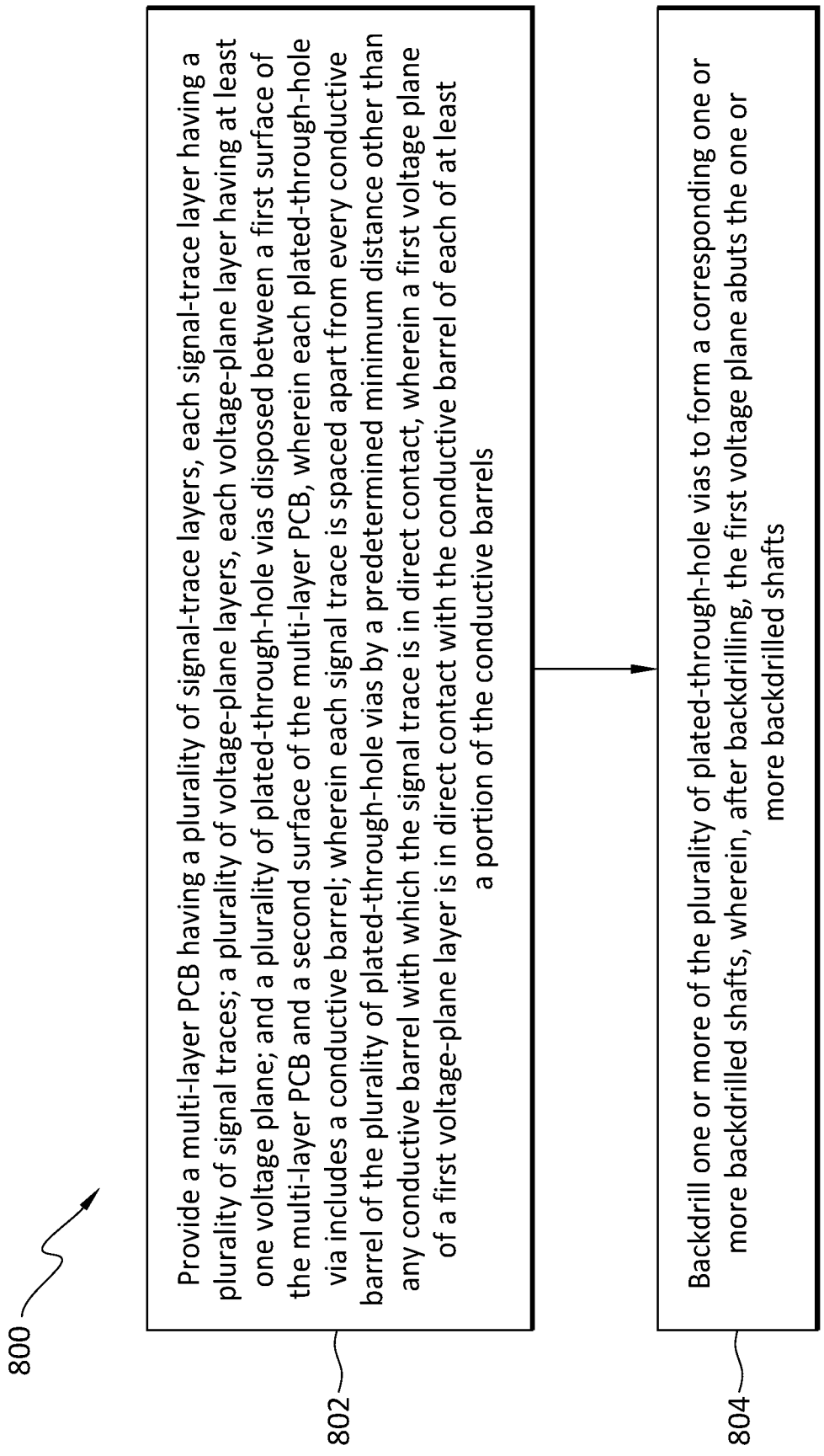
FIG. 8 is a flow diagram of a method in accordance with this disclosure.

FIG. 8 is a flow diagram of an illustrative method 800 in accordance with this disclosure. Method 800 may be used to produce multi-layer PCBs that have plated-through-holes vias in which the non-functional portion of their conductive barrels (i.e., via stubs) have been removed, and in which anti-pads have been eliminated from at least one voltage plane. Method 800 includes providing 802 a multi-layer PCB, which itself includes a plurality of signal-trace layers, each signal-trace layer having a plurality of signal traces; a plurality of voltage-plane layers, each voltage-plane layer having at least one voltage plane; and a plurality of plated-through-hole vias disposed between a first surface of the multi-layer PCB and a second surface of the multi-layer PCB, wherein each plated-through-hole via includes a conductive barrel; wherein each signal trace is spaced apart from every conductive barrel of the plurality of plated-through-hole vias by a predetermined minimum distance other than any conductive barrel with which the signal trace is in direct contact, wherein a first voltage plane of a first voltage-plane layer is in direct contact with the conductive barrel of each of at least a portion of the conductive barrels of the plurality of plated-through-hole vias. Method 800 further includes backdrilling 804 one or more of the plurality of plated-through-hole vias to form a corresponding one or more backdrilled shafts, wherein, after backdrilling, the first voltage plane abuts the one or more backdrilled shafts.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "vertical/vertically" means nominally orthogonal to the surface of the object being referenced.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances.

As used herein, the term "about" indicates the value of a given quantity may vary from its nominal value based on, for example, various manufacturing tolerances. By way of example, and not limitation, the term "about" may indicate the cited value of a given quantity may vary within, for example, 1-30% of the value (e.g., ±0.5%, ±1%, ±5%, ±10%, ±20%, or ±30% of the value). Specific ranges are provided herein when needed.

Unless stated otherwise, terms such as "first" and "second" are used to arbitrarily distinguish between the elements such terms describe. Thus, these terms are not necessarily intended to indicate temporal or other prioritization of such elements.

It should be appreciated by those skilled in the art that any block diagrams herein represent conceptual views of illustrative hardware embodying the principles of the aspects.

While each of the embodiments are described above in terms of their structural arrangements, it should be appreciated that the aspects also cover the associated methods of using the embodiments described above.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the subjacent claims.

What is claimed is:

1. A multi-layer printed circuit board (PCB), comprising:
a plurality of signal-trace layers, each signal-trace layer having a plurality of signal traces;
a plurality of voltage-plane layers, each voltage-plane layer having at least one voltage plane; and
a plurality of plated-through-hole vias disposed between a first surface of the multi-layer PCB and a second surface of the multi-layer PCB, wherein each plated-through-hole via includes a conductive barrel,
wherein each signal trace is spaced apart from every conductive barrel of each of the conductive barrels of the plurality of plated-through-hole vias by a predetermined minimum distance other than any conductive barrel with which it is in direct contact, and
wherein a first voltage plane of a first voltage-plane layer is in direct contact with each of the conductive barrels of a first portion of the plurality of plated-through-hole vias, including the conductive barrels of the first portion of the plurality of plated-through-hole vias that are in direct contact with at least one signal trace.

2. The multi-layer PCB of claim 1, wherein a second voltage plane of a second voltage-plane layer is in direct contact with each of the conductive barrels of a first portion of the plurality of plated-through-hole vias, including the conductive barrels of the first portion of the plurality of plated-through-hole vias that are in direct contact with at least one signal trace.

3. The multi-layer PCB of claim 2, wherein the first voltage plane and the second voltage plane are each part of a first electrical node.

4. The multi-layer PCB of claim 3, wherein a third voltage plane of a third voltage-plane layer is spaced apart from every conductive barrel of each of the conductive barrels of the plurality of plated-through-hole vias by the predetermined minimum distance other than any conductive barrel with which it is in direct contact.

5. The multi-layer PCB of claim 4, wherein the plurality of signal-trace layers and the plurality of voltage-plane layers are inner layers of the multi-layer PCB.

6. A multi-layer printed circuit board (PCB), comprising:
a plurality of signal-trace layers, each signal-trace layer having a plurality of signal traces;
a plurality of voltage-plane layers, each voltage-plane layer having at least one voltage plane; and
a plurality of plated-through-hole vias disposed in the multi-layer PCB, each plated-through-hole via having a conductive barrel,
wherein a first portion of the plated-through-hole vias have conductive barrels that extend from the first outer surface to a conductive barrel inner end located within the multi-layer PCB, and corresponding backdrilled shafts that extend from the conductive barrel inner end to the second outer surface, and
wherein a first voltage plane of a first voltage-plane-layer abuts at least one backdrilled shaft.

7. The multi-layer PCB of claim 6, wherein a first portion of the plurality of plated-through-hole vias have conductive barrels that extend vertically from a first outer surface of the multi-layer PCB to a second outer surface of the multi-layer PCB, and
wherein each signal trace is spaced apart from every conductive barrel of the plurality of plated-through-hole vias by a predetermined minimum distance other than any conductive barrel with which the signal trace is in direct contact.

8. The multi-layer PCB of claim 7, wherein a second voltage plane of a second voltage-plane-layer abuts at least one backdrilled shaft.

9. The multi-layer PCB of claim 8, wherein the first voltage plane and the second voltage plane are each part of a same electrical node.

10. The multi-layer PCB of claim 9, wherein the first voltage plane and the second voltage plane are vertically separated by at least one intervening signal-trace layer.

11. The multi-layer PCB of claim 6, wherein at least one backdrilled shaft of the plurality of backdrilled shafts has non-conductive material disposed therein.

12. The multi-layer PCB of claim 11, wherein the at least one backdrilled shaft is filled with the non-conductive material.

13. The multi-layer PCB of claim 9, wherein a third voltage plane of a third voltage-plane layer is spaced apart from every conductive barrel of the plurality of plated-through-hole vias by the predetermined minimum distance other than any conductive barrel with which it is in direct contact.

14. The multi-layer PCB of claim 13, wherein the third voltage plane is vertically disposed between the first voltage plane and the second voltage plane.

15. The multi-layer PCB of claim 7, wherein at least one voltage plane has a plurality of holes, each hole having a diameter less than the predetermined minimum distance.

16. A method, comprising:
    providing a multi-layer printed circuit board (PCB) comprising:
        a plurality of signal-trace layers, each signal-trace layer having a plurality of signal traces;
        a plurality of voltage-plane layers, each voltage-plane layer having at least one voltage plane; and
        a plurality of plated-through-hole vias disposed between a first surface of the multi-layer PCB and a second surface of the multi-layer PCB, wherein each plated-through-hole via includes a conductive barrel;
    wherein each signal trace is spaced apart from every conductive barrel of the plurality of plated-through-hole vias by a predetermined minimum distance other than any conductive barrel with which the signal trace is in direct contact, and
    wherein a first voltage plane of a first voltage-plane layer is in direct contact with the conductive barrel of each of at least a portion of the conductive barrels of the plurality of plated-through-hole vias; and
    backdrilling one or more of the plurality of plated-through-hole vias to form a corresponding one or more backdrilled shafts,
    wherein, after backdrilling, the first voltage plane abuts at least one backdrilled shaft.

17. The method of claim 16, further comprising:
    filling at least one of the one or more backdrilled shafts with a non-conductive filler material.

18. The method of claim 16, wherein the multi-layer PCB further comprises:
    a second voltage plane of a second voltage-plane layer, the second voltage plane in direct contact with each of the conductive barrels of a first portion of the plurality of plated-through-hole vias, including the conductive barrels of the first portion of the plurality of plated-through-hole vias that are in direct contact with at least one signal trace.

19. The method of claim 18, wherein the first voltage plane and the second voltage plane are each part of a first electrical node.

20. The method of claim 19, wherein the multi-layer PCB further comprises:
    a third voltage plane of a third voltage-plane layer is spaced apart from every conductive barrel of each of the conductive barrels of the plurality of plated-through-hole vias by the predetermined minimum distance other than any conductive barrel with which it is in direct contact.

* * * * *